(12) United States Patent
Kim et al.

(10) Patent No.: US 11,538,861 B2
(45) Date of Patent: Dec. 27, 2022

(54) VARIABLE RESISTANCE MEMORY DEVICE

(71) Applicant: Samsung Electronics Co., Ltd., Suwon-si (KR)

(72) Inventors: Hui-Jung Kim, Seongnam-si (KR); Kiseok Lee, Hwaseong-si (KR); Keunnam Kim, Yongin-si (KR); Yoosang Hwang, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 149 days.

(21) Appl. No.: 17/167,851

(22) Filed: Feb. 4, 2021

(65) Prior Publication Data

US 2021/0159277 A1 May 27, 2021

Related U.S. Application Data

(63) Continuation of application No. 16/455,791, filed on Jun. 28, 2019, now Pat. No. 10,937,833.

(30) Foreign Application Priority Data

Jun. 29, 2018 (KR) .................. 10-2018-0075153
Feb. 27, 2019 (KR) .................. 10-2019-0023108

(51) Int. Cl.
*H01L 47/00* (2006.01)
*H01L 27/24* (2006.01)
*H01L 45/00* (2006.01)
*H01L 43/08* (2006.01)

(52) U.S. Cl.
CPC .......... *H01L 27/2481* (2013.01); *H01L 45/06* (2013.01); *H01L 45/1233* (2013.01); *H01L 45/1253* (2013.01); *H01L 43/08* (2013.01)

(58) Field of Classification Search
CPC ..... H01L 27/2481; H01L 45/06; H01L 45/08; H01L 45/1233
USPC ............................................. 257/4
See application file for complete search history.

(56) References Cited

U.S. PATENT DOCUMENTS

| | | | |
|---|---|---|---|
| 7,577,016 | B2 | 8/2009 | Jeong et al. |
| 9,252,362 | B2 | 2/2016 | Pio |
| 9,276,041 | B2 | 3/2016 | Toh et al. |
| 9,412,935 | B1 | 8/2016 | Lin |
| 9,460,768 | B2 | 10/2016 | Manipatruni et al. |
| 9,484,389 | B2 | 11/2016 | Wouters et al. |
| 9,691,475 | B2 | 6/2017 | Redaelli |

(Continued)

*Primary Examiner* — Phuc T Dang
(74) *Attorney, Agent, or Firm* — Muir Patent Law, PLLC

(57) ABSTRACT

Disclosed is a variable resistance memory device including a first conductive line extending in a first direction parallel to a top surface of the substrate, memory cells spaced apart from each other in the first direction on a side of the first conductive line and connected to the first conductive line, and second conductive lines respectively connected to the memory cells. Each second conductive line is spaced apart in a second direction from the first conductive line. The second direction is parallel to the top surface of the substrate and intersects the first direction. The second conductive lines extend in a third direction perpendicular to the top surface of the substrate and are spaced apart from each other in the first direction. Each memory cell includes a variable resistance element and a select element that are positioned at a same level horizontally arranged in the second direction.

7 Claims, 44 Drawing Sheets

(56) References Cited

U.S. PATENT DOCUMENTS

| | | |
|---|---|---|
| 9,837,471 B2 | 12/2017 | Shepard et al. |
| 9,871,076 B2 | 1/2018 | Toh et al. |
| 2013/0062590 A1 | 3/2013 | Sonehara et al. |
| 2014/0284540 A1* | 9/2014 | Suguro ............... H01L 27/2463 |
| | | 118/723 R |
| 2017/0154844 A1 | 6/2017 | Kim et al. |
| 2017/0177514 A1 | 6/2017 | Lee |
| 2017/0271580 A1* | 9/2017 | Park ................... H01L 27/2481 |
| 2018/0233664 A1* | 8/2018 | Iwamoto ................. H01L 45/08 |
| 2019/0088316 A1* | 3/2019 | Inuzuka ............... G11C 13/003 |
| 2019/0131348 A1* | 5/2019 | Ko ....................... H01L 23/528 |

* cited by examiner

FIG. 5
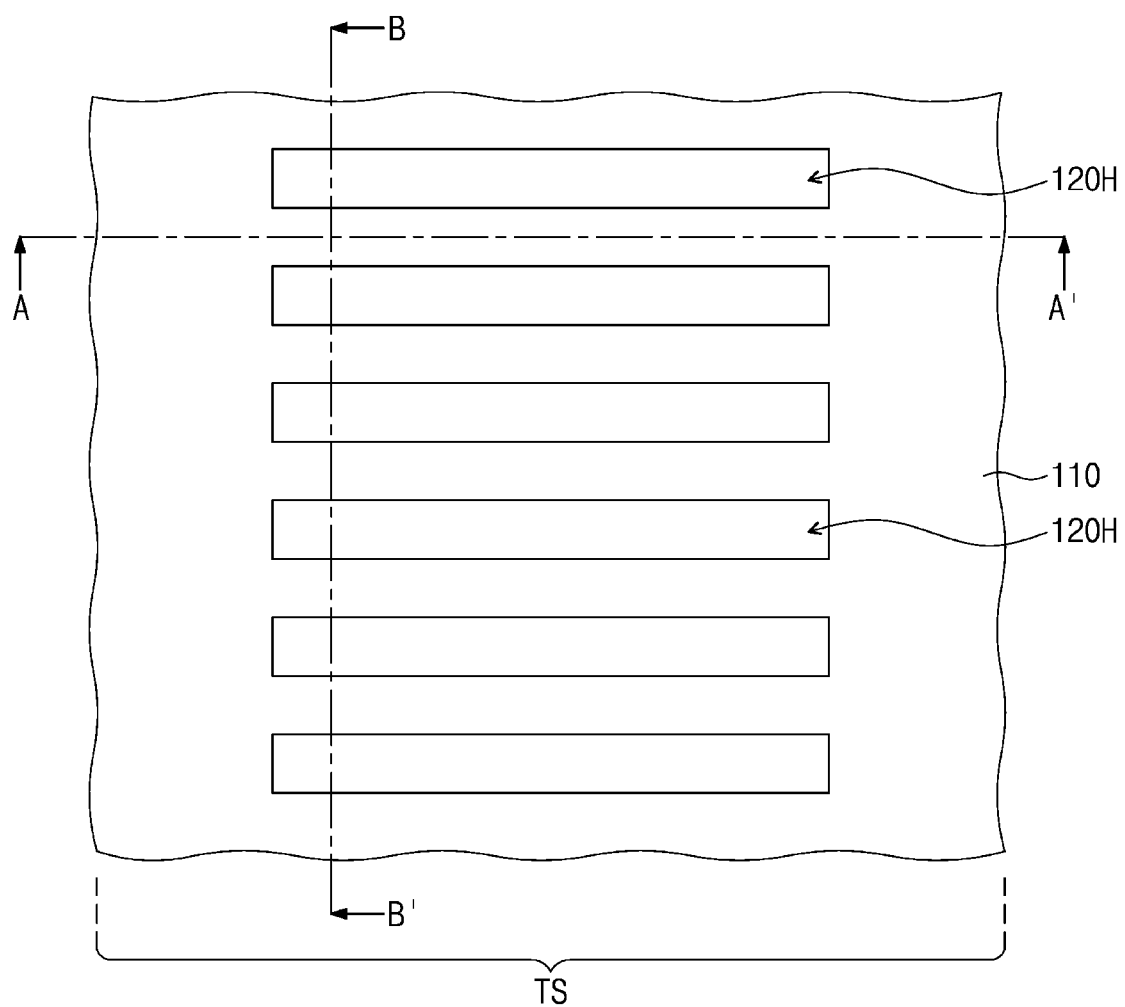
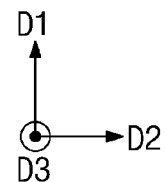

FIG. 7
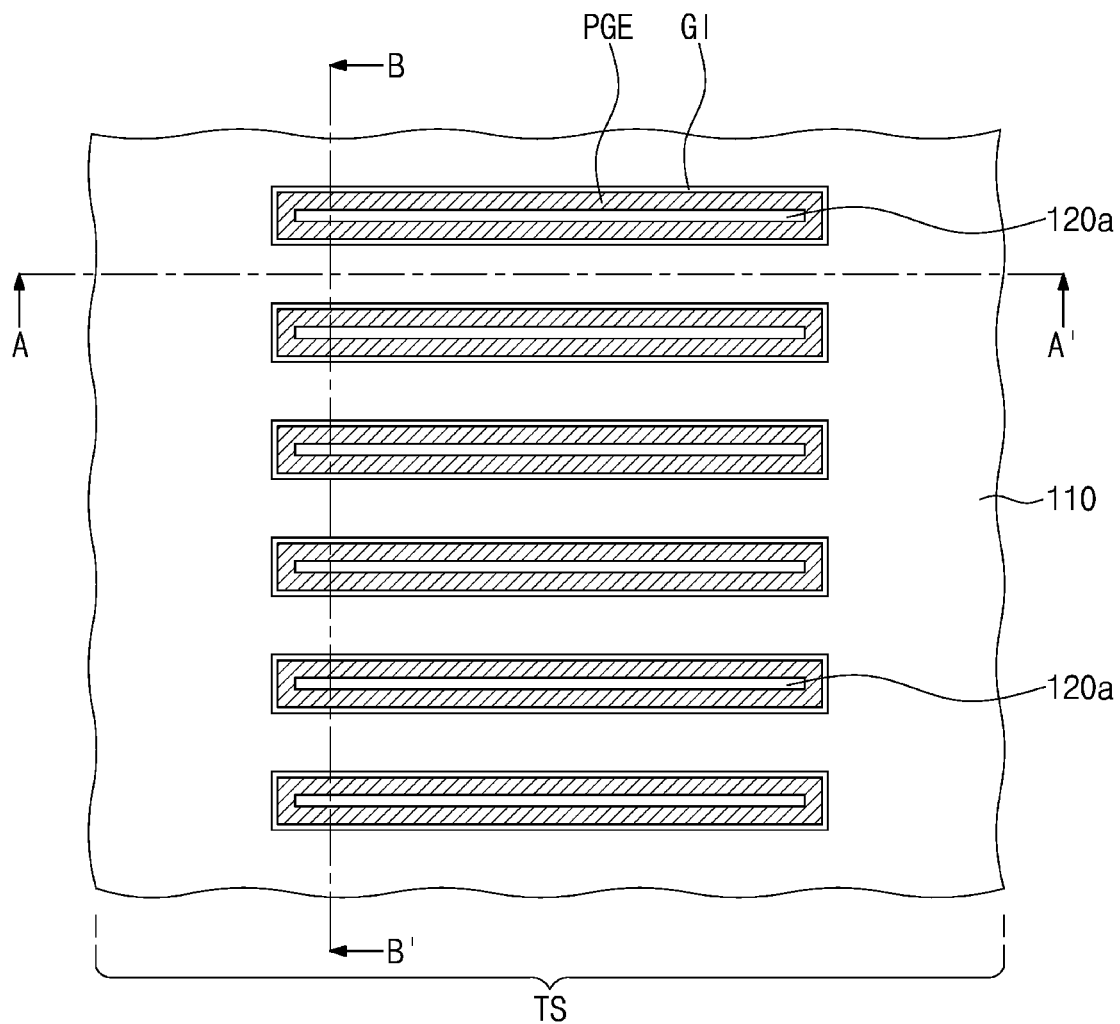
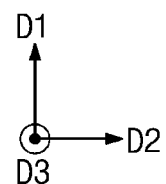

FIG. 12B
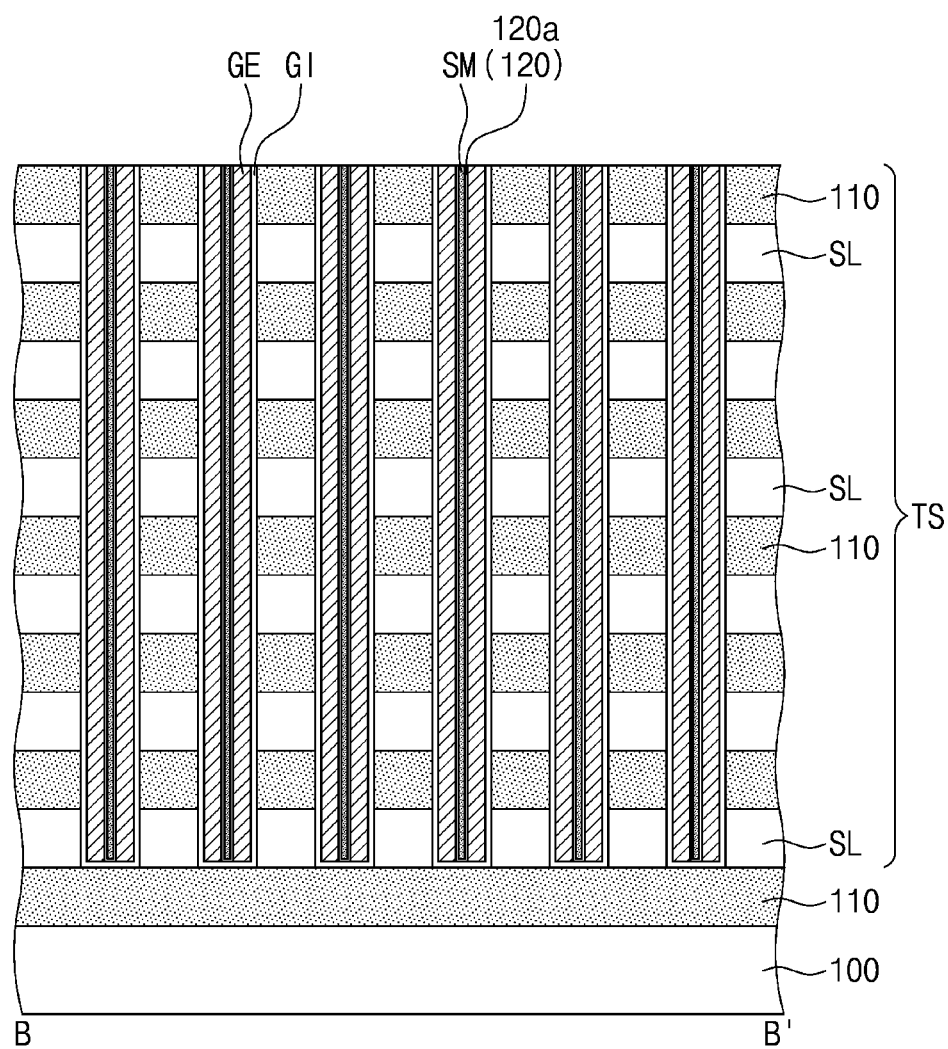
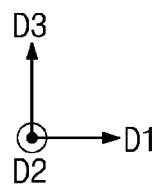

FIG. 14C
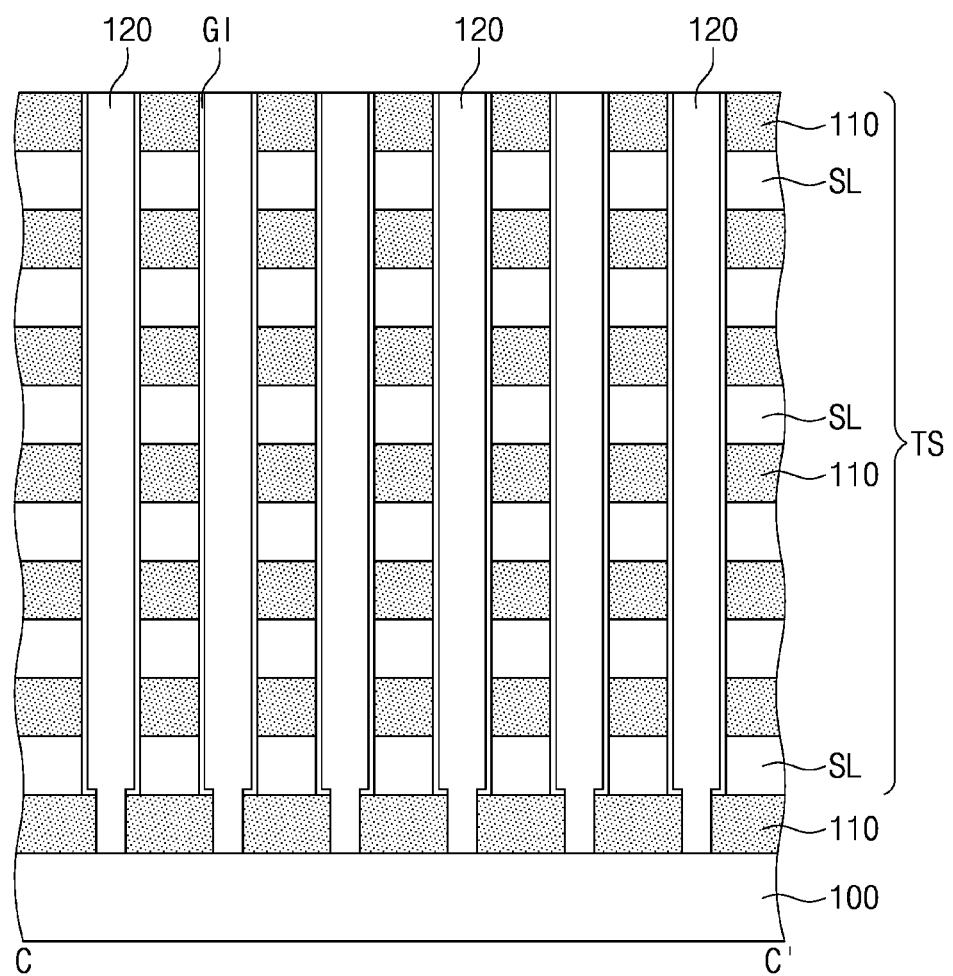
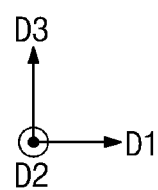

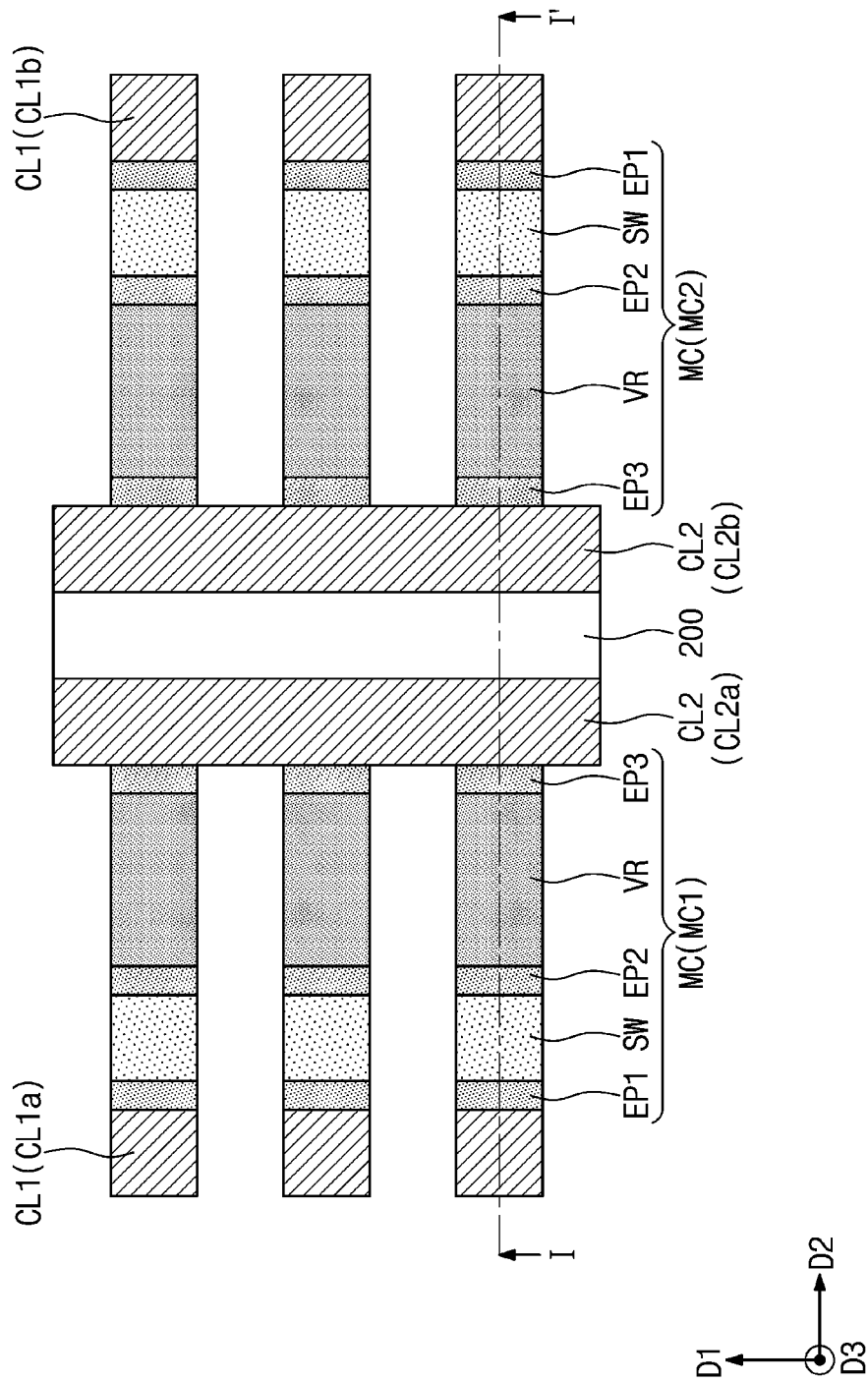

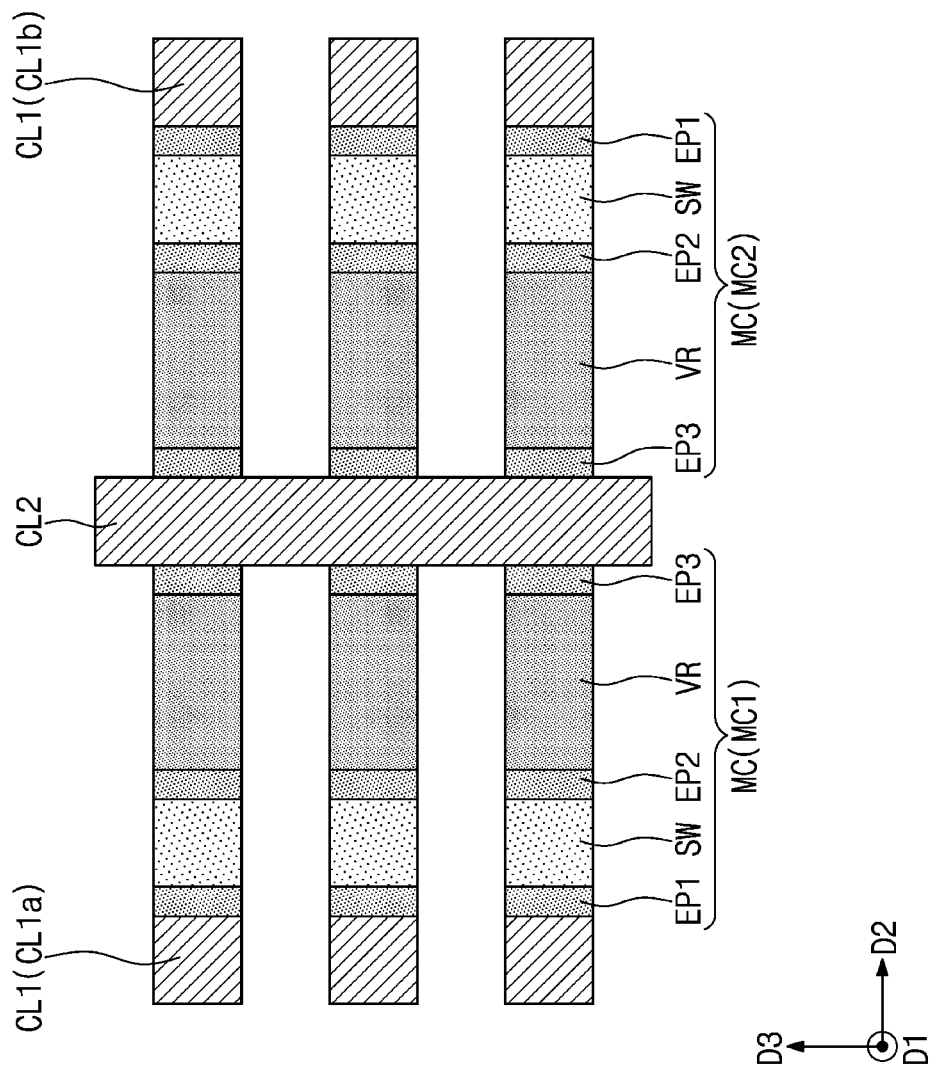

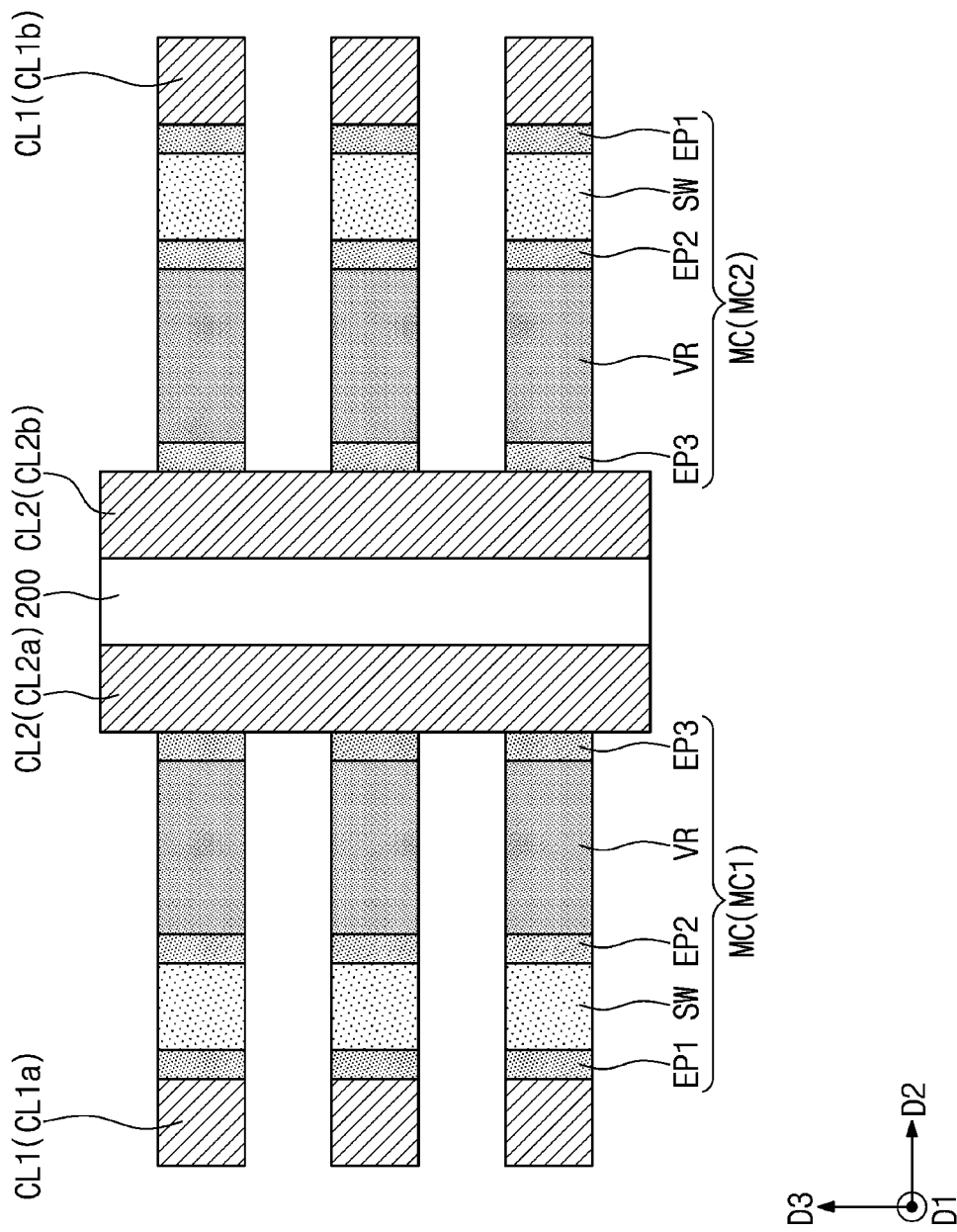

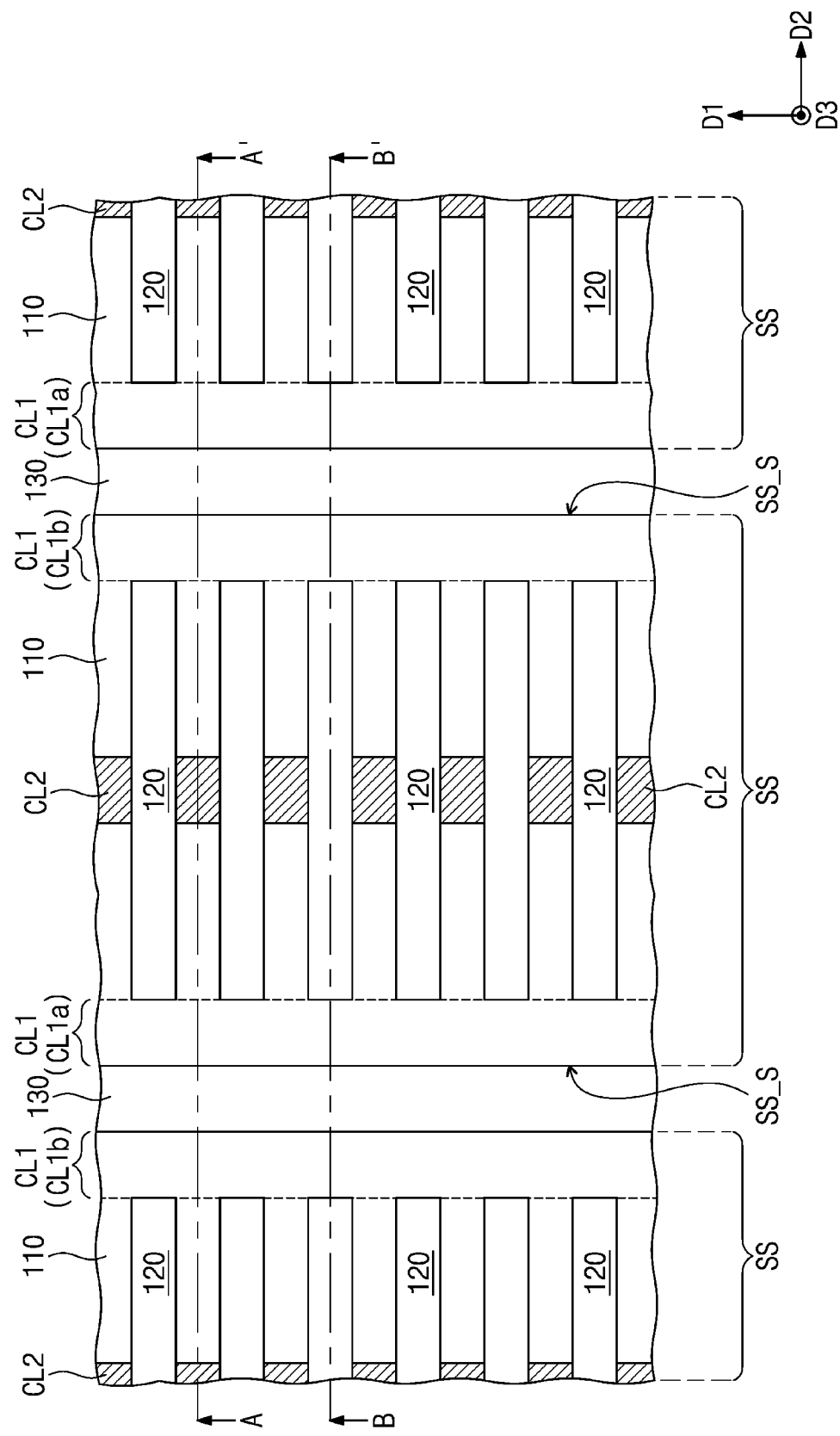

VARIABLE RESISTANCE MEMORY DEVICE

CROSS-REFERENCE TO RELATED APPLICATION

This U.S. nonprovisional application is a continuation of and claims priority to U.S. patent application Ser. No. 16/455,791 filed Jun. 28, 2019 now U.S. Pat. No. 10,937,833, which claims priority under 35 U.S.C § 119 to Korean Patent Application Nos. 10-2018-0075153 filed on Jun. 29, 2018 and 10-2019-0023108 filed on Feb. 27, 2019 in the Korean Intellectual Property Office, the entire contents of which are hereby incorporated by reference.

BACKGROUND

The present inventive concepts relate to a variable resistance memory device, and more particularly, to a variable resistance memory device having three-dimensionally arranged memory cells.

Semiconductor devices have been highly integrated to meet high performance and low manufacturing cost which are required by customers. Because integration of the semiconductor devices is an important factor in determining product price, high integration is increasingly demanded. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor devices. To overcome the above limitations, three-dimensional semiconductor devices having three-dimensionally arranged memory cells have been proposed. Next generation semiconductor memory devices, for example, MRAM (Magnetic Random Access Memory) and PRAM (Phase Change Random Access Memory) are recently being developed to meet the trend of high performance and low power of the semiconductor memory device.

SUMMARY

Some example embodiments of the present inventive concepts provide a variable resistance memory device with increased integration and a method of fabricating the same.

According to some example embodiments of the present inventive concepts, a variable resistance memory device includes a first conductive line on a substrate and extending in a first direction parallel to a top surface of the substrate, memory cells arranged spaced apart from each other in the first direction on a side of the first conductive line and connected to the first conductive line, and second conductive lines respectively connected to the memory cells. Each of the second conductive lines is spaced apart in a second direction from the first conductive line. The second direction is parallel to the top surface of the substrate and intersects the first direction. The second conductive lines extend in a third direction perpendicular to the top surface of the substrate and are spaced apart from each other in the first direction. Each of the memory cells includes a variable resistance element and a select element that are positioned at a same level from the top surface of the substrate and horizontally arranged in the second direction.

According to some example embodiments of the present inventive concepts, a variable resistance memory device includes first conductive lines extending in a first direction parallel to a top surface of the substrate, second conductive lines spaced apart in a second direction from the first conductive lines, the second direction being parallel to the top surface of the substrate and different from the first direction, the second conductive lines extending in a third direction perpendicular to the top surface of the substrate and being spaced apart from each other in the first direction, the first conductive lines being spaced apart from each other in the third direction, and memory cells between the first conductive lines and the second conductive lines, the memory cells being spaced apart from each other in the first direction and the third direction. Each of the memory cells is connected to a corresponding one of the first conductive lines and a corresponding one of the second conductive lines. Each of the memory cells includes a variable resistance element and a select element that are positioned at a same level from the top surface of the substrate and horizontally arranged in the second direction.

According to some example embodiments of the present inventive concept, a variable resistance memory device includes a first conductive line on a substrate and extending in a first direction parallel to a top surface of the substrate, memory cells and vertical dielectric patterns alternately arranged in the first direction on a lateral surface of the first conductive line, each of the memory cells including a variable resistance element and a select element that are horizontally arranged in a second direction that is parallel to the top surface of the substrate and different from the first direction, and second conductive lines respectively connected to the memory cells. The second conductive lines extend in a third direction perpendicular to the top surface of the substrate and be spaced apart from each other in the first direction.

BRIEF DESCRIPTION OF THE DRAWINGS

FIGS. 5, 7, 9, 11, 13, and 15 illustrate plan views showing a method of fabricating a variable resistance memory device according to some example embodiments of the present inventive concepts.

FIGS. 6B, 8B, 10B, 12B, 14B, and 16B illustrate cross-sectional views taken along line B-B' of FIGS. 5, 7, 9, 11, 13, and 15, respectively.

FIGS. 10C, 12C, 14C, and 16C illustrate cross-sectional views taken along line C-C' of FIGS. 9, 11, 13, and 15, respectively.

FIG. 20A illustrates a plan view showing the variable resistance memory device of FIG. 19.

FIG. 22B illustrates a cross-sectional view taken along line I-I' of FIG. 22A.

FIG. 24B illustrates a cross-sectional view taken along line I-I' of FIG. 24A.

FIG. 25 illustrates a plan view showing a variable resistance memory device according to some example embodiments of the present inventive concepts.

DETAILED DESCRIPTION OF EMBODIMENTS

The following will now describe in detail some example embodiments of the present inventive concepts with reference to the accompanying drawings.

Figure 1:
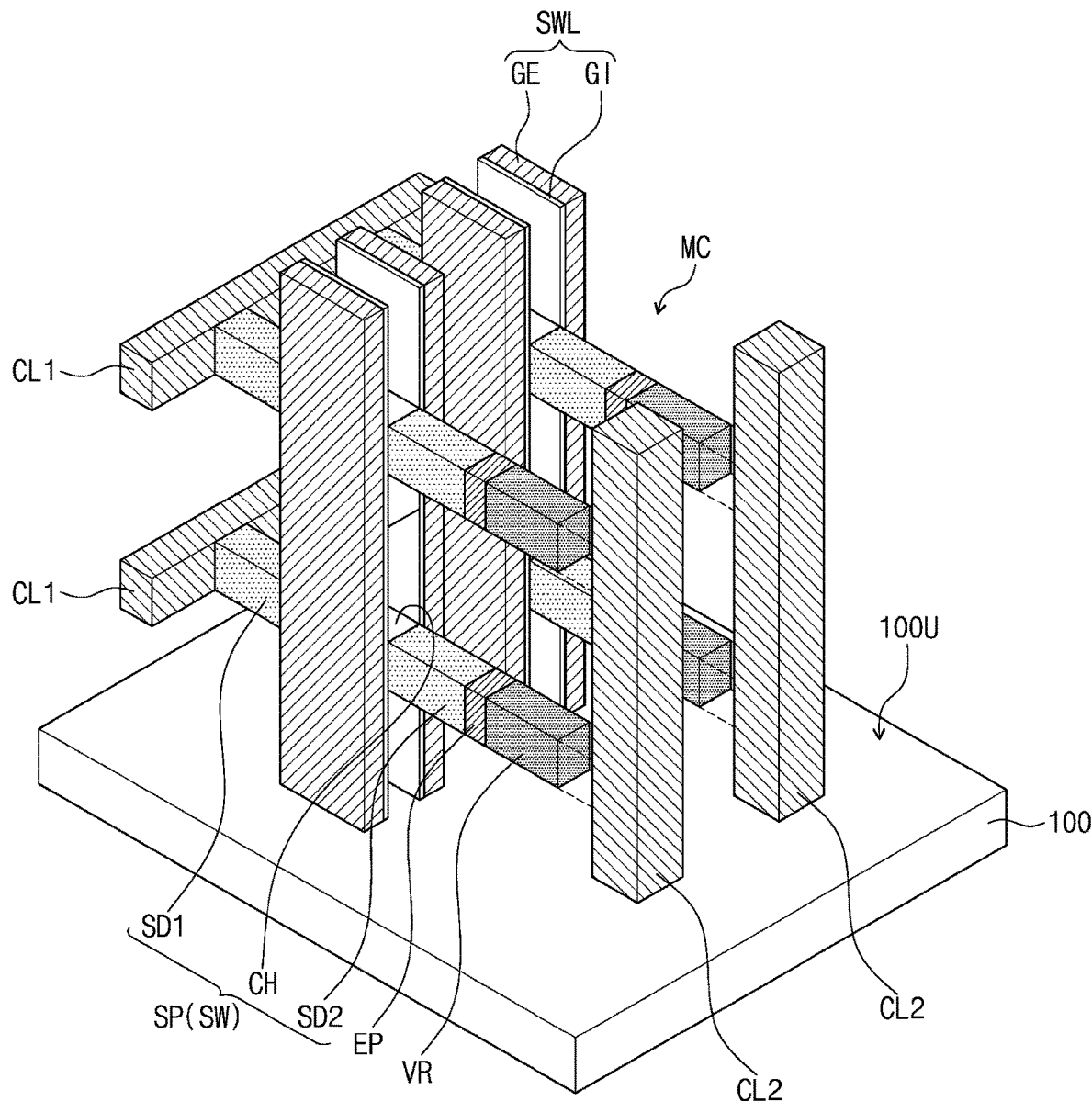
FIG. 1 illustrates a simplified perspective view showing a variable resistance memory device according to some example embodiments of the present inventive concepts.
Figure 2A:
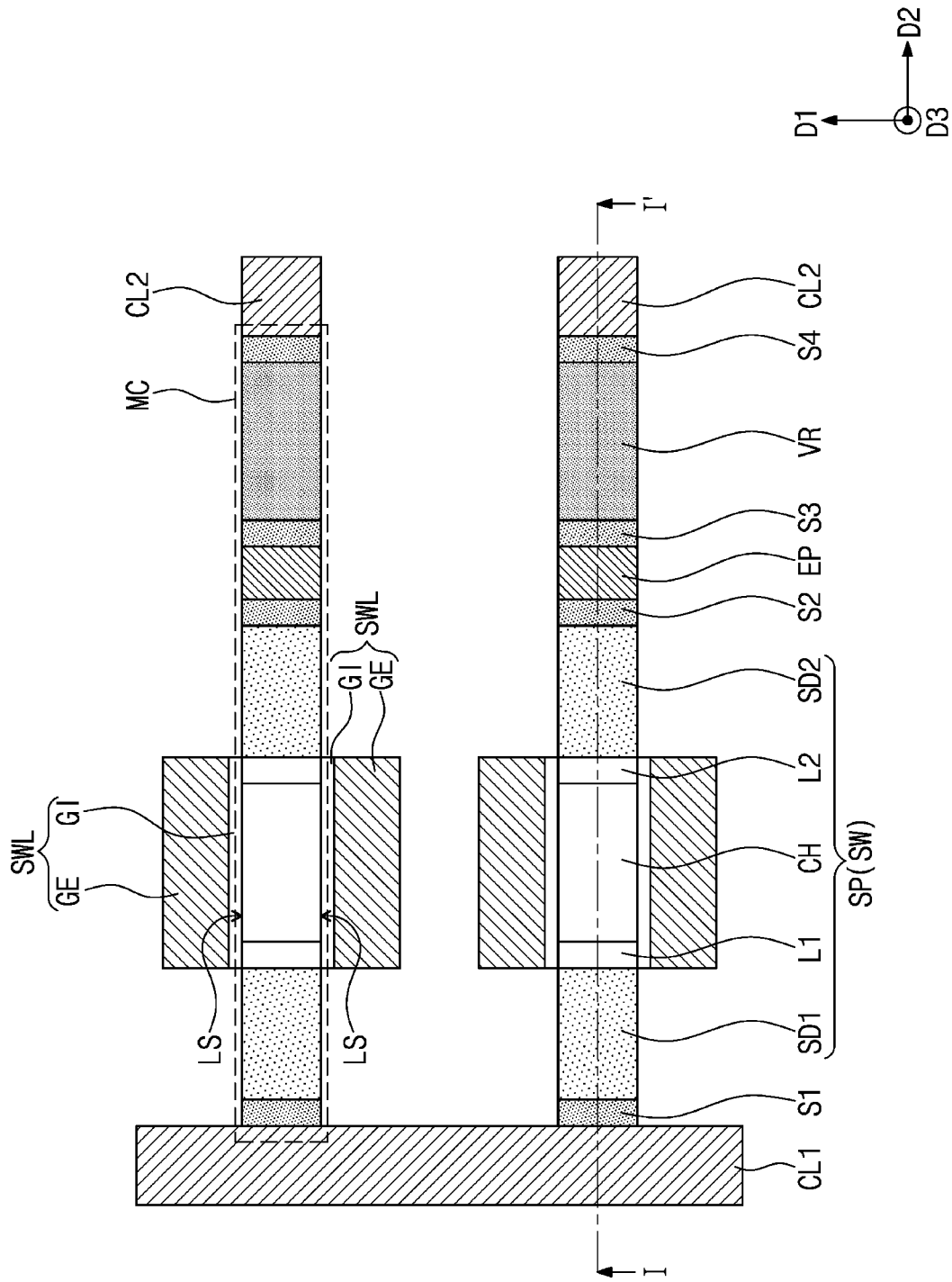
FIG. 2A illustrates a plan view showing the variable resistance memory device of FIG. 1.
Figure 2B:
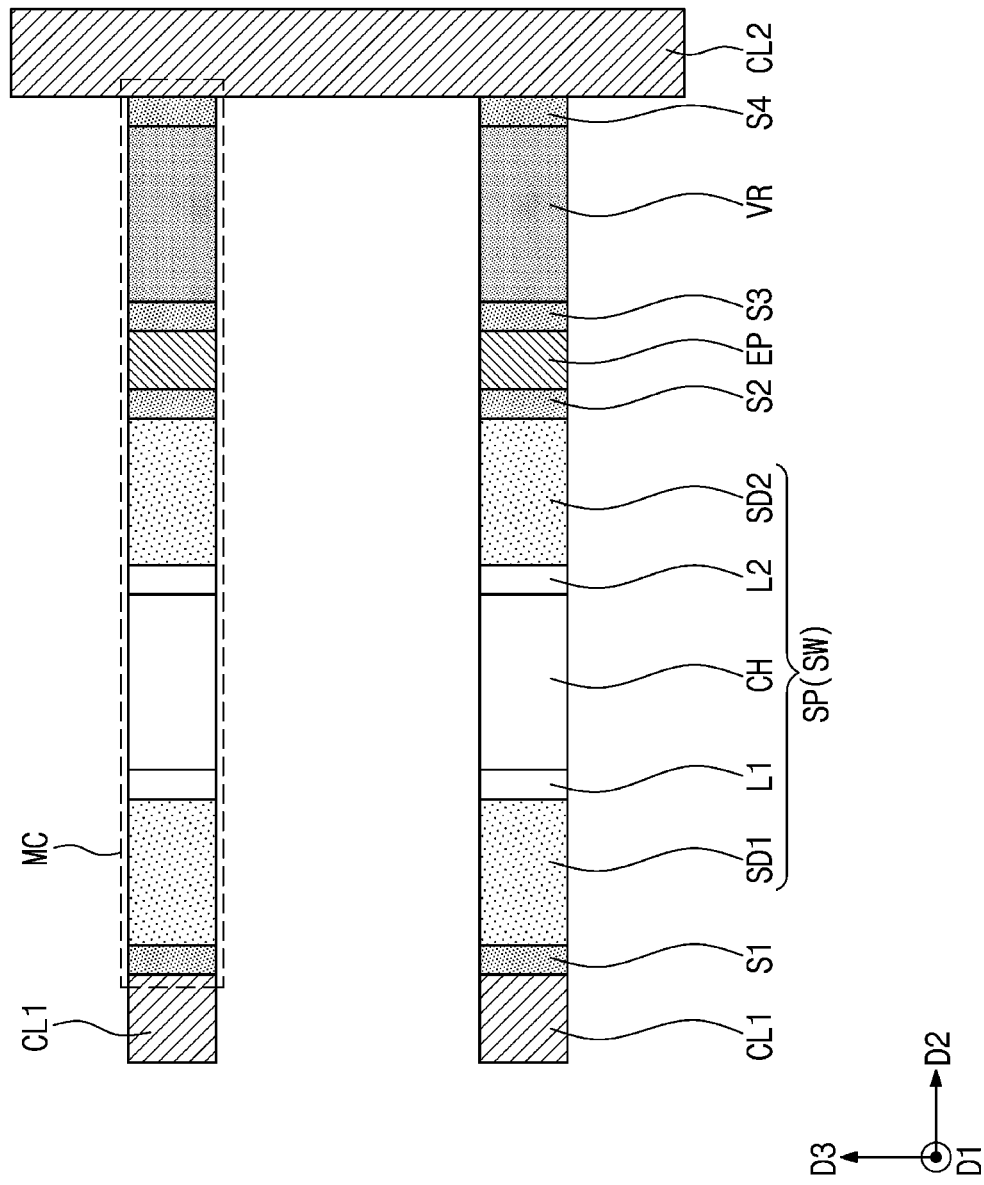
FIG. 2B illustrates a cross-sectional view taken along line I-I' of FIG. 2A.

FIG. 1 illustrates a simplified perspective view showing a variable resistance memory device according to some example embodiments of the present inventive concepts. FIG. 2A illustrates a plan view showing the variable resistance memory device of FIG. 1. FIG. 2B illustrates a cross-sectional view taken along line I-I' of FIG. 2A.

Referring to FIGS. 1, 2A, and 2B, a substrate 100 may be provided thereon with first conductive lines CL1 and second conductive lines CL2 running across the first conductive lines CL1. The first conductive lines CL1 may extend in a first direction D1 parallel to a top surface 100U of the substrate 100. The second conductive lines CL2 may be spaced apart from the first conductive lines CL1 in a second direction D2 that is parallel to the top surface 100U of the substrate 100 and different from the first direction D1, while extending in a third direction D3 perpendicular to the top surface 100U of the substrate 100. The first conductive lines CL1 may be spaced apart from each other in the third direction D3, and the second conductive lines CL2 may be spaced apart from each other in the first direction D1.

Memory cells MC may be disposed between the first conductive lines CL1 and the second conducive lines CL2, and spaced apart from each other in the first direction D1 and the third direction D3. The memory cells MC may be disposed at corresponding intersections between the first conductive lines CL1 and the second conductive lines CL2. Each of the first conductive lines CL1 may be connected in common to a plurality of memory cells MC that are spaced apart from each other in the first direction D1, and the plurality of memory cells MC may be connected to corresponding second conductive lines CL2. Each of the second conductive lines CL2 may be connected in common to a plurality of memory cells MC that are spaced apart from each other in the third direction D3, and the plurality of memory cells MC may be connected to corresponding first conductive lines CL1. Each of the memory cells MC may be disposed between a corresponding one of the first conductive lines CL1 and a corresponding one of the second conductive lines CL2, and connected to the corresponding first conductive line CL1 and the corresponding second conductive line CL2.

Each of the memory cells MC may include a variable resistance element VR and a select element SW. The variable resistance element VR and the select element SW may be horizontally arranged in the second direction D2, and connected in series between the corresponding first conductive line CL1 and the corresponding second conductive line CL2. The variable resistance element VR may include a material that stores data based on resistance variation. In certain embodiments, the variable resistance element VR may include a magnetic tunnel junction pattern, which may include a fixed layer whose magnetization direction is fixed in one direction, a free layer whose magnetization direction can be switched parallel or anti-parallel to the magnetization direction of the fixed layer, and a tunnel barrier layer between the fixed layer and the free layer. In this case, the memory cells MC may include magnetic random access memory (MRAM) cells. In other embodiments, the variable resistance element VR may include a material that can reversibly change its phase between a crystalline state and an amorphous state, based on temperature. For example, the variable resistance element VR may include a compound in which one or more of Te and Se (chalcogen elements) are combined with one or more of Ge, Sb, Bi, Pb, Sn, Ag, As, S, Si, In, Ti, Ga, P, O, and C. The variable resistance element VR may include one or more of GeSbTe, GeTeAs, SbTeSe, GeTe, SbTe, SeTeSn, GeTeSe, SbSeBi, GeBiTe, GeTeTi, InSe, GaTeSe, and InSbTe, or include a super-lattice structure in which a Ge-containing layer (e.g., GeTe layer) and a Ge-free layer (e.g., SbTe layer) are repeatedly stacked. In this case, the memory cells MC may include phase change random access memory (PRAM) cells. In an embodiment of the present inventive concept, the memory cells MC may be arranged three dimensionally. For example, the memory cells MC may be arranged in a plurality of horizontal groups and in a plurality of vertical groups. In this case, each memory cell may be associated with a corresponding one of the horizontal groups and one of the vertical groups. The plurality of horizontal groups may be stacked vertically (i.e., in the third direction) on the top surface of the substrate 100. Each of the plurality of horizontal groups may include at least two memory cells that are connected in common to a corresponding one of the first conductive lines CL1. In this case, each of the at least two memory cells in each horizontal group may be connected to a corresponding one of the second conductive lines CL2. Each of the horizontal groups and the corresponding one of the first conductive lines CL1 may be positioned at the same level from the top surface of the substrate 100. The plurality of vertical groups may be arranged spaced apart from each other in the first direction. Each of the plurality of vertical groups may include at least two memory cells stacked on each other in the third direction. The at least two memory cells in each of the plurality of vertical groups may be connected in common to a corresponding one of the second conductive lines CL2. Each of the at least two memory cells in each of the vertical groups may be connected to a corresponding one of the first conductive lines CL1.

In certain embodiments, the select element SW may include a semiconductor pattern SP. The semiconductor pattern SP may include a first impurity region SD1, a second impurity region SD2, and a channel region CH between the first and second impurity regions SD1 and SD2. The first impurity region SD1, the second impurity region SD2, and the channel region CH may be horizontally arranged in the second direction D2, and the first impurity region SD1 and the second impurity region SD2 may be spaced apart in the second direction D2 from each other across the channel region CH. The semiconductor pattern SP may further include a first sub-impurity region L1 between the first impurity region SD1 and the channel region CH and also further include a second sub-impurity region L2 between the second impurity region SD2 and the channel region CH. The first impurity region SD1 and the first sub-impurity region L1 may have a different conductive type from that of the channel region CH, and the first impurity region SD1 may have an impurity concentration greater than that of the first sub-impurity region L1. The second impurity region SD2 and the second sub-impurity region L2 may have a different conductive type from that of the channel region CH, and the second impurity region SD2 may have an impurity concentration greater than that of the second sub-impurity region L2. The first and second impurity regions SD1 and SD2 and the first and second sub-impurity regions L1 and L2 may have the same conductive type. The semiconductor pattern SP may include, for example, silicon, germanium, silicon-germanium, or indium gallium zinc oxide (IGZO). The first and second impurity regions SD1 and SD2 and the first and second sub-impurity regions L1 and L2 may include, for example, N-type impurities or P-type impurities.

Each of the memory cells MC may further include an electrode EP between the variable resistance element VR and the select element SW. The electrode EP may electrically connect the variable resistance element VR and the select element SW to each other, and prevent a direct contact between the variable resistance element VR and the select element SW. The electrode EP may include metal, for example, one or more of W, Ti, Al, Cu, C, CN, TiN, TiAlN, TiSiN, TiCN, WN, CoSiN, WSiN, TaN, TaCN, TaSiN, and TiO. In certain embodiments, each of the memory cells MC may further include a first ohmic pattern S1 between the select element SW and the corresponding first conductive line CL1 (or the corresponding second conductive line CL2), a second ohmic pattern S2 between the select element SW and the electrode EP, a third ohmic pattern S3 between the electrode EP and the variable resistance element VR, and a fourth ohmic pattern S4 between the variable resistance element VR and the corresponding second conductive line CL2 (or the corresponding first conductive line CL1). The first to fourth ohmic patterns S1 to S4 may include metal silicide.

Select lines SWL may be disposed between the first conductive lines CL1 and the second conductive lines CL2, and connected to the memory cells MC. The select lines SWL may extend in the third direction D3 and be spaced apart from each other in the first direction D1. Each of the select lines SWL may be connected in common to corresponding memory cells MC that are spaced apart from each other in the third direction D3. Each of the select lines SWL may be connected to the select element SW (e.g., the semiconductor pattern SP) of each of the corresponding memory cells MC. The semiconductor pattern SP may have lateral surfaces LS that face each other in the first direction D1, and each of the select lines SWL may be disposed on a corresponding one of the lateral surfaces LS of the semiconductor pattern SP. Each of the select lines SWL may include a gate electrode GE adjacent to the channel region CH of the semiconductor pattern SP and also include a gate dielectric layer GI between the gate electrode GE and the channel region CH of the semiconductor pattern SP. In certain embodiments, the semiconductor pattern SP of each of the memory cells MC may be interposed between a pair of ones of the select lines SWL. The pair of select lines SWL may be disposed on corresponding lateral surfaces LS of the semiconductor pattern SP. In this case, the pair of select lines SWL may be configured to receive the same voltage. In an example embodiment, each of the first conductive lines CL1 may be electrically connected to a corresponding variable resistance element VR depending on whether the switch element SW turns on. Each of the second conductive lines CL2 may be electrically connected to a corresponding variable resistance element VR. In an example embodiment, each of the second conductive lines CL2 may be in contact with the corresponding variable resistance element VR or a conductive material may be interposed between each of the second conductive lines CL2 and the corresponding variable resistance element VR. In this case, the first conductive lines CL1 may be referred to as bit lines through which data may be written to or read from the memory cells MC. The second conductive lines CL2 may be referred to common electrodes.

Figure 3:
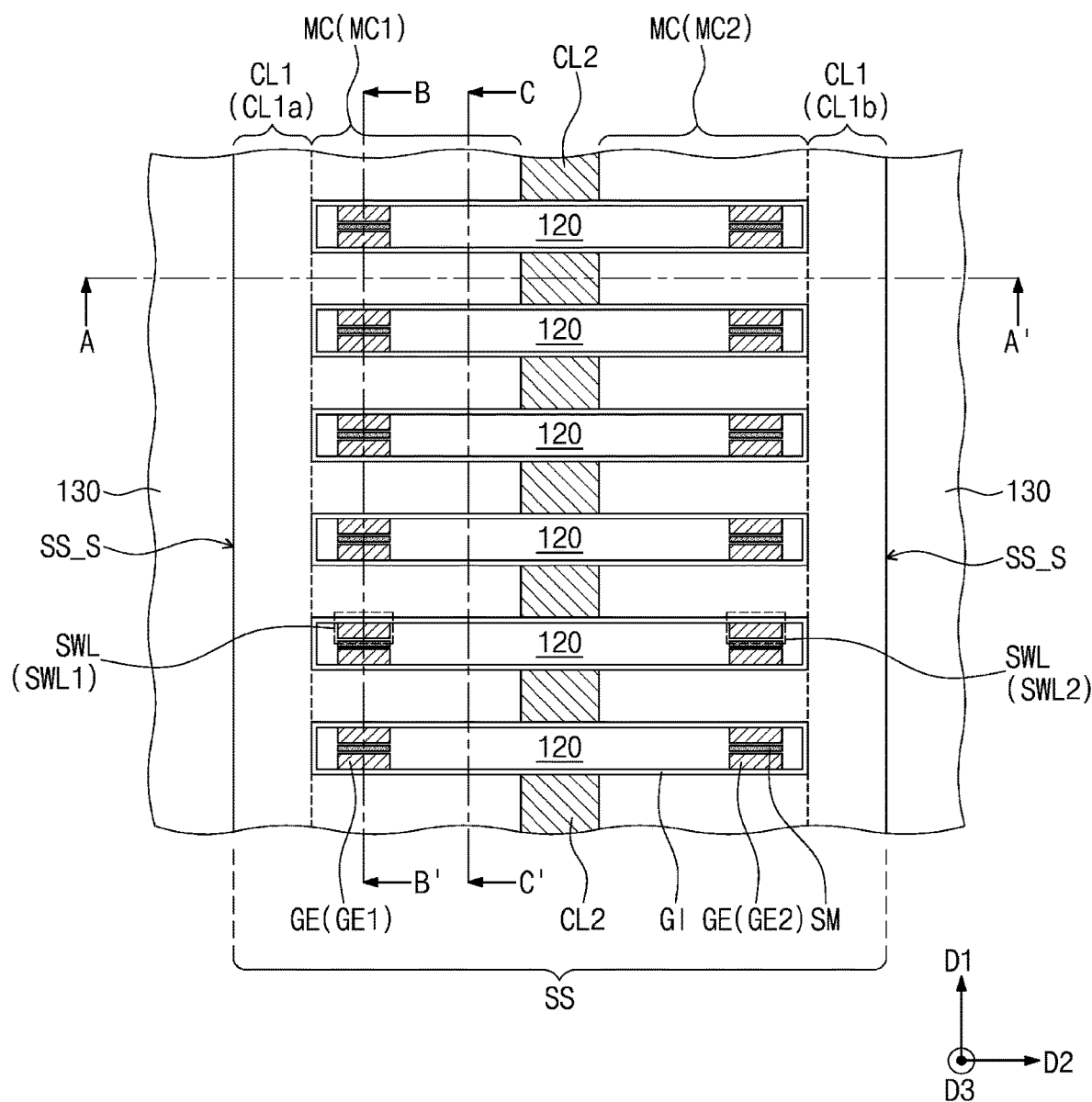
FIG. 3 illustrates a plan view showing a variable resistance memory device according to some example embodiments of the present inventive concepts.
Figure 4A:
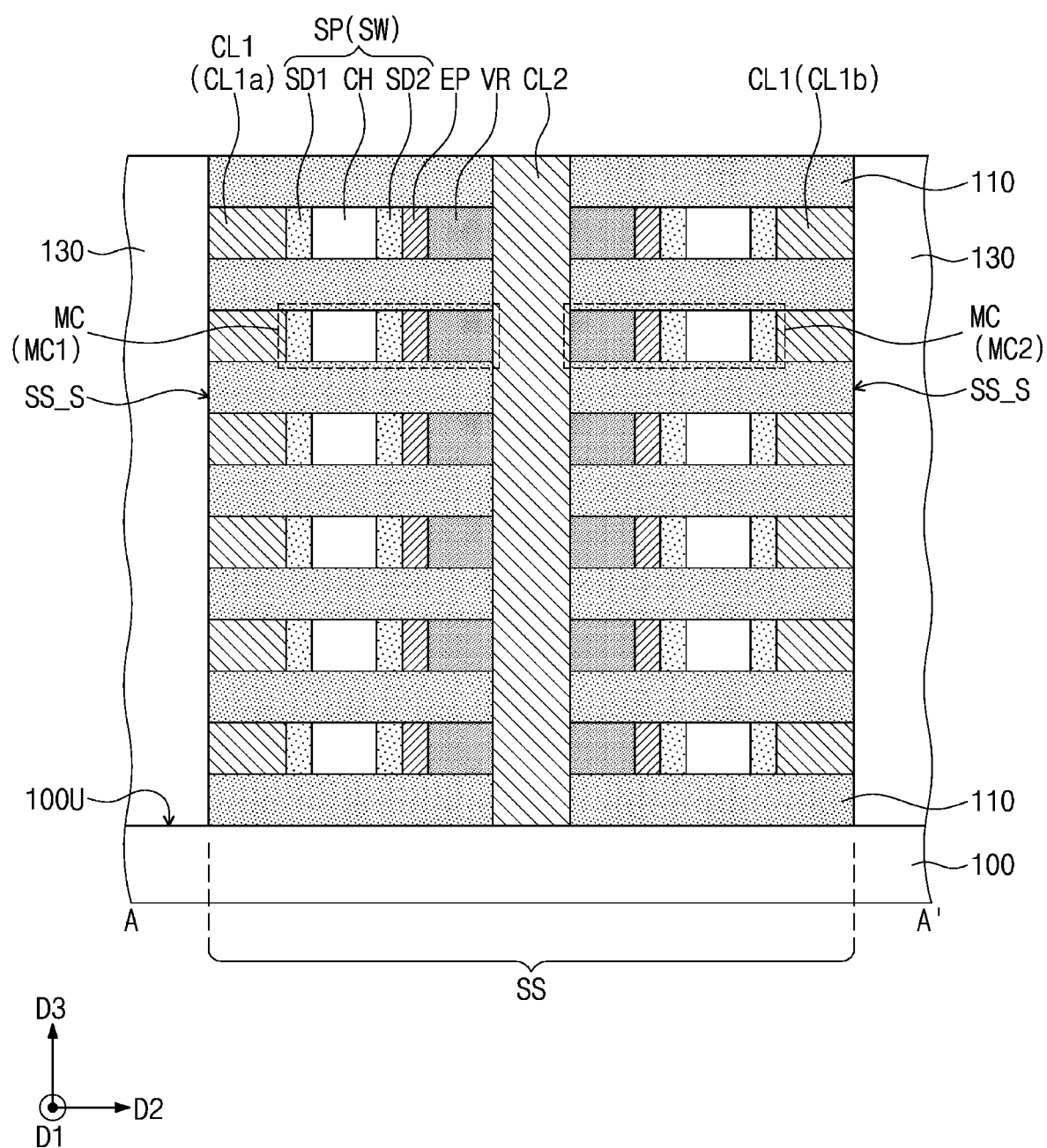
FIGS. 4A, 4B, and 4C illustrate cross-sectional views respectively taken along lines A-A', B-B', and C-C' of FIG. 3.
Figure 4B:
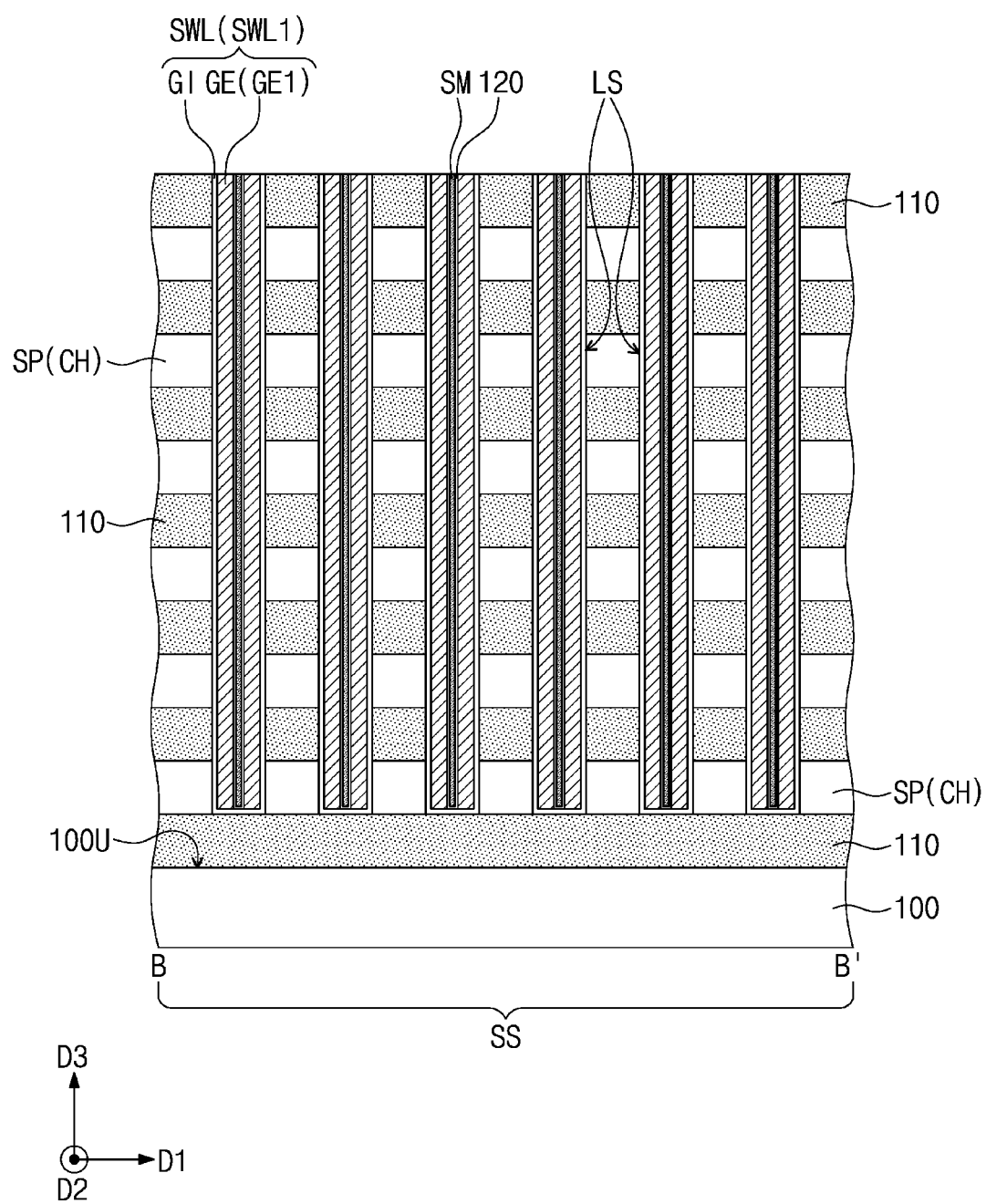
Figure 4C:
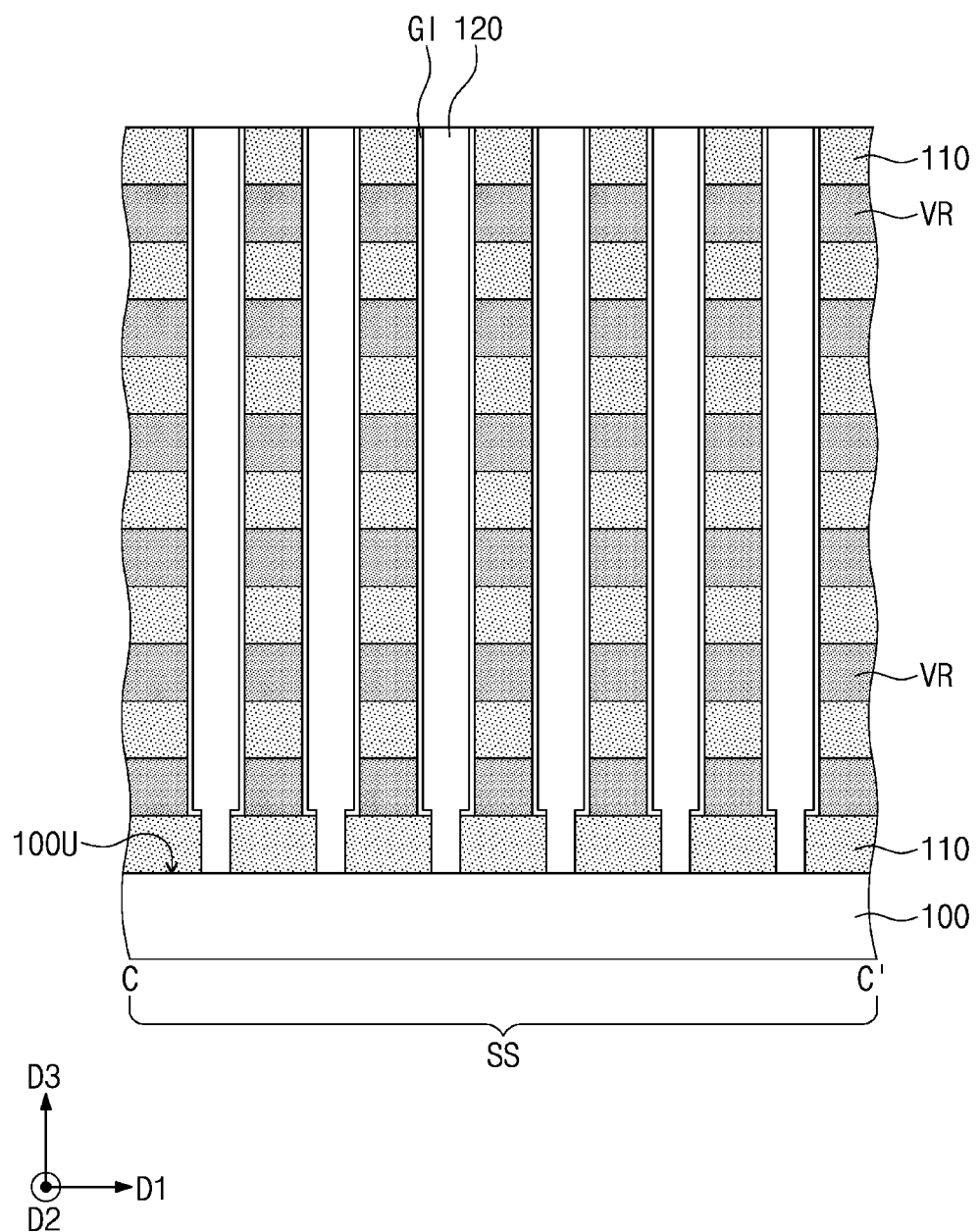

FIG. 3 illustrates a plan view showing a variable resistance memory device according to some example embodiments of the present inventive concepts. FIGS. 4A, 4B, and 4C illustrate cross-sectional views respectively taken along lines A-A', B-B', and C-C' of FIG. 3.

Referring to FIGS. 3, 4A, 4B and 4C, a stack structure SS may be provided on a substrate 100. The substrate 100 may include a semiconductor substrate. The substrate 100 may further include a thin layer formed on the semiconductor substrate, but the present inventive concepts are not limited thereto. The stack structure SS may extend in a first direction D1 parallel to a top surface 100U of the substrate 100. The substrate 100 may be provided thereon with isolation dielectric patterns 130 on opposite sides of the stack structure SS. The isolation dielectric patterns 130 may correspondingly cover opposite lateral surfaces SS_S of the stack structure SS. The isolation dielectric patterns 130 may extend in the first direction D1 and be spaced apart from each other in a second direction D2 that is parallel to the top surface 100U of the substrate 100 and different from the first direction D1. The isolation dielectric patterns 130 may be spaced apart in the second direction D2 from each other across the stack structure SS. The isolation dielectric patterns 130 may include, for example, one or more of oxide, nitride, and oxynitride.

The stack structure SS may include dielectric layers 110 and first conductive lines CL1 that are alternately stacked in a third direction D3 perpendicular to the top surface 100U of the substrate 100. A lowermost one of the dielectric layers 110 may be interposed between the substrate 100 and a lowermost one of the first conductive lines CL1, but the present inventive concepts are not limited thereto.

The first conductive lines CL1 may extend in the first direction D1. The first conductive lines CL1 may include first sub-conductive lines CL1a and second sub-conductive lines CL1b. The first sub-conductive lines CL1a may extend in the first direction D1 and be spaced apart from each other in the third direction D3. The first sub-conductive lines CL1a may be separated from each other by the dielectric layers 110 therebetween. The second sub-conductive lines CL1b may extend in the first direction D1 and be spaced apart from each other in the third direction D3. The second sub-conductive lines CL1*b* may be separated from each other by the dielectric layers 110 therebetween. The second sub-conductive lines CL1*b* may be spaced apart in the second direction D2 from the first sub-conductive lines CL1*a*. One of the isolation dielectric patterns 130 may cover lateral surfaces of the first sub-conductive lines CL1*a* and lateral surfaces of the dielectric layers 110 between the first sub-conductive lines CL1*a*. Other one of the isolation dielectric patterns 130 may cover lateral surfaces of the second sub-conductive lines CL1*b* and lateral surfaces of the dielectric layers 110 between the second sub-conductive lines CL1*b*. One of the first sub-conductive lines CL1*a* and one of the second sub-conductive lines CL1*b* may be horizontally spaced apart in the second direction D2 from each other on a corresponding one of the dielectric layers 110.

The stack structure SS may include second conductive lines CL2 between the first sub-conductive lines CL1*a* and the second sub-conductive lines CL1*b*. The second conductive lines CL2 may extend in the third direction D3 and be spaced apart from each other in the first direction D1. The second conductive lines CL2 may run across the first sub-conductive lines CL1*a* and the second sub-conductive lines CL1*b*. Each of the second conductive lines CL2 may penetrate the dielectric layers 110. The first conductive lines CL1 and the second conductive lines CL2 may include one or more of metal (e.g., copper, tungsten, or aluminum) and metal nitride (e.g., tantalum nitride, titanium nitride, or tungsten nitride). The dielectric layers 110 may include, for example, silicon nitride.

The stack structure SS may include vertical dielectric patterns 120 between the first sub-conductive lines CL1*a* and the second sub-conductive lines CL1*b*. The vertical dielectric patterns 120 may extend in the third direction D3 and be spaced apart from each other in the first direction D1. The second conductive lines CL2 and the vertical dielectric patterns 120 may be alternately arranged in the first direction D1 between the first sub-conductive lines CL1*a* and the second sub-conductive lines CL1*b*. Each of the second conductive lines CL2 may be interposed between the vertical dielectric patterns 120 that neighbor each other in the first direction D1. When viewed in plan, each of the vertical dielectric patterns 120 may have a linear shape extending in the second direction D2. Each of the vertical dielectric patterns 120 may penetrate the dielectric layers 110. The vertical dielectric patterns 120 may include, for example, one or more of oxide, nitride, and oxynitride.

The stack structure SS may include memory cells MC at corresponding intersections between the first conductive lines CL1 and the second conductive lines CL2. The memory cells MC may include first memory cells MC1 at corresponding intersections between the first sub-conductive lines CL1*a* and the second conductive lines CL2 and also include second memory cells MC2 at corresponding intersections between the second sub-conductive lines CL1*b* and the second conductive lines CL2. The first memory cells MC1 may be spaced apart from each other in the first and third directions D1 and D3 between the first sub-conductive lines CL1*a* and the second conductive lines CL2. Each of the first sub-conductive lines CL1*a* may be connected in common to corresponding first memory cells MC1 that are spaced apart from each other in the first direction D1, and the corresponding first memory cells MC1 may be connected to corresponding second conductive lines CL2. The first memory cells MC1 spaced apart in the first direction D1 may be separated from each other by the vertical dielectric patterns 120 therebetween. Each of the second conductive lines CL2 may be connected in common to corresponding first memory cells MC1 that are spaced apart from each other in the third direction D3, and the corresponding first memory cells MC1 may be connected to corresponding first sub-conductive lines CL1*a*. The first memory cells MC1 spaced apart in the third direction D3 may be separated from each other by the dielectric layers 110 therebetween.

The second memory cells MC2 may be spaced apart from each other in the first and third directions D1 and D3 between the second sub-conductive lines CL1*b* and the second conductive lines CL2. Each of the second sub-conductive lines CL1*b* may be connected in common to corresponding second memory cells MC2 that are spaced apart from each other in the first direction D1, and the corresponding second memory cells MC2 may be connected to corresponding second conductive lines CL2. The second memory cells MC2 spaced apart in the first direction D1 may be separated from each other by the vertical dielectric patterns 120 therebetween. Each of the second conductive lines CL2 may be connected in common to corresponding second memory cells MC2 that are spaced apart from each other in the third direction D3, and the corresponding second memory cells MC2 may be connected to corresponding second sub-conductive lines CL1*b*. The second memory cells MC2 spaced apart in the third direction D3 may be separated from each other by the dielectric layers 110 therebetween. The second memory cells MC2 may be spaced apart in the second direction D2 from the first memory cells MC1.

Each of the memory cells MC may include a variable resistance element VR, a select element SW, and an electrode EP between the variable resistance element VR and the select element SW. The variable resistance element VR, the select element SW, and the electrode EP may be horizontally arranged in a parallel direction (e.g., the second direction D2) to the top surface 100U of the substrate 100. Each of the memory cells MC may be locally provided between a pair of vertical dielectric patterns 120 neighboring each other in the first direction D1 and between a pair of dielectric layers 110 neighboring each other in the third direction D3. Therefore, the variable resistance element VR, the select element SW, and the electrode EP may be horizontally arranged between the pair of vertical dielectric patterns 120 and between the pair of dielectric layers 110. The variable resistance element VR and the select element SW that are included in each of the first memory cells MC1 may be connected in series between a corresponding first sub-conductive line CL1*a* and a corresponding second conductive line CL2. The variable resistance element VR and the select element SW that are included in each of the second memory cells MC2 may be connected in series between a corresponding second sub-conductive line CL1*b* and a corresponding second conductive line CL2.

The memory cells MC may include a pair of memory cells MC that are spaced apart in the second direction D2 from each other across a corresponding second conductive line CL2. The pair of memory cells MC may include one of the first memory cells MC1 and one of the second memory cells MC2. The pair of memory cells MC may be connected in common to the corresponding second conductive line CL2, and one of the pair of memory cells MC may be connected to a corresponding first sub-conductive line CL1*a* and the other of the pair of memory cells MC may be connected to a corresponding second sub-conductive line CL1*b*. The corresponding second conductive line CL2 and the pair of memory cells MC connected thereto may be arranged in the second direction D2 on one surface of a corresponding vertical dielectric pattern 120. For example, the corresponding second conductive line CL2 and the pair of memory cells MC connected thereto may be arranged in the second direction D2 between the vertical dielectric patterns 120 that are adjacent to each other in the first direction D1.

The second memory cells MC2 may be configured symmetrically about the second conductive lines CL2 with the first memory cells MC1. For example, the pair of memory cells MC may be symmetric with each other about the corresponding second conductive line CL2. In certain embodiments, the variable resistance element VR of the first memory cell MC1 and the variable resistance element VR of the second memory cell MC2 may be connected in common to the corresponding second conductive line CL2, and the select element SW of the first memory cell MC1 and the select element SW of the second memory cell MC2 may be connected respectively to the corresponding first sub-conductive line CL1a and the corresponding second sub-conductive line CL1b. In other embodiments, differently from that shown, the select element SW of the first memory cell MC1 and the select element SW of the second memory cell MC2 may be connected in common to the corresponding second conductive line CL2, and the variable resistance element VR of the first memory cell MC1 and the variable resistance element VR of the second memory cell MC2 may be connected respectively to the corresponding first sub-conductive line CL1a and the corresponding second sub-conductive line CL1b.

As discussed with reference to FIGS. 1, 2A, and 2B, the variable resistance element VR may include a material that stores data based on resistance variation. The select element SW may include a semiconductor pattern SP. The semiconductor pattern SP may include a first impurity region SD1, a second impurity region SD2, and a channel region CH between the first and second impurity regions SD1 and SD2. The electrode EP may be interposed between the variable resistance element VR and the semiconductor pattern SP. Each of the memory cells MC may be configured substantially the same as the memory cell MC discussed with reference to FIGS. 1, 2A, and 2B.

Gate electrodes GE may be disposed in the vertical dielectric patterns 120. Each of the gate electrodes GE may have a linear shape extending in the third direction D3 and penetrate a corresponding one of the vertical dielectric patterns 120. The gate electrodes GE may extend in the third direction D3 and parallel to the second conductive line CL2. The gate electrodes GE may include first gate electrodes GE1 adjacent to the first memory cells MC1 and second gate electrodes GE2 adjacent to the second memory cells MC2. The first gate electrodes GE1 may extend in the third direction D3 and be spaced apart from each other in the first direction D1. Each of the first gate electrodes GE1 may penetrate a corresponding one of the vertical dielectric patterns 120 and be disposed adjacent to corresponding first memory cells MC1 that are spaced apart from each other in the third direction D3. Each of the first gate electrodes GE1 may be adjacent to the semiconductor pattern SP (e.g., the channel region CH) of each of the first memory cells MC1 that are spaced apart from each other in the third direction D3. The semiconductor pattern SP may have lateral surfaces LS that face each other in the first direction D1, and each of the first gate electrodes GE1 may be disposed on a corresponding one of the lateral surfaces LS of the semiconductor pattern SP. In certain embodiments, the semiconductor pattern SP of each of the first memory cells MC1 may be interposed between a pair of first gate electrodes GE1. The pair of first gate electrodes GE1 may be disposed on corresponding lateral surfaces LS of the semiconductor pattern SP. In this case, the pair of first gate electrodes GE1 may be configured to receive the same voltage.

The second gate electrodes GE2 may extend in the third direction D3 and be spaced apart from each other in the first direction D1. Each of the second gate electrodes GE2 may penetrate a corresponding one of the vertical dielectric patterns 120 and be adjacent to corresponding second memory cells MC2 that are spaced apart from each other in the third direction D3. Each of the second gate electrodes GE2 may be adjacent to the semiconductor pattern SP (e.g., the channel region CH) of each of the second memory cells MC2 that are spaced apart from each other in the third direction D3. Each of the second gate electrodes GE2 may be disposed on a corresponding one of the lateral surfaces LS of the semiconductor pattern SP. In certain embodiments, the semiconductor pattern SP of each of the second memory cells MC2 may be interposed between a pair of second gate electrodes GE2. The pair of second gate electrodes GE2 may be disposed on corresponding lateral surfaces LS of the semiconductor pattern SP. In this case, the pair of second gate electrodes GE2 may be configured to receive the same voltage.

A gate dielectric layer GI may be interposed between each of the gate electrodes GE and the semiconductor pattern SP of each of the memory cells MC corresponding to the gate electrodes GE. The gate dielectric layer GI may extend in the third direction D3 and be interposed between each of the gate electrodes GE and the dielectric layers 110 corresponding to the gate electrodes GE. The gate dielectric layer GI may extend between each of the vertical dielectric patterns 120 and the memory cells MC corresponding to the vertical dielectric patterns 120 and between each of the vertical dielectric patterns 120 and the dielectric layers 110 corresponding to the vertical dielectric patterns 120. The gate dielectric layer GI may extend between each of the vertical dielectric patterns 120 and the second conductive lines CL2 corresponding to the vertical dielectric patterns 120. When viewed in plan, the gate dielectric layer GI may have a ring shape that surrounds each of the vertical dielectric patterns 120. A select line SWL may be constituted by one of the gate electrodes GE and a portion of the gate dielectric layer GI adjacent to one of the gate electrodes GE. For example, a first select line SWL1 may be constituted by one of the first gate electrodes GE1 and a portion of the gate dielectric layer GI adjacent to one of the first gate electrodes GE1, and a second select line SWL2 may be constituted by one of the second gate electrodes GE2 and a portion of the gat dielectric layer GI adjacent to one of the second gate electrodes GE2.

The gate electrodes GE may include one or more of metal (tungsten, titanium, tantalum, etc.) and conductive metal nitride (titanium nitride, tantalum nitride, etc.), and the gate dielectric layer GI may include one or more of a high-k dielectric layer, a silicon oxide layer, a silicon nitride layer, and a silicon oxynitride layer. For example, the high-k dielectric layer may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In certain embodiments, shield lines SM may be disposed in each of the vertical dielectric patterns 120. One of the shield lines SM may be interposed between the first gate electrodes GE1 that neighbor each other in the first direction D1 in each of the vertical dielectric patterns 120, and other one of the shield lines SM may be interposed between the second gate electrodes GE2 that neighbor each other in the first direction D1 in each of the vertical dielectric patterns 120. The shield lines SM may each have a linear shape extending in the third direction D3. The shield lines SM may prevent coupling between neighboring gate electrodes GE and be connected to one or more nodes that apply a ground voltage. The shield lines SM may include metal.

According to the present inventive concepts, each of the memory cells MC may include the variable resistance element VR and the select element SW that are horizontally arranged in a parallel direction (e.g., the second direction D2) to the top surface 100U of the substrate 100. Accordingly, it may be easy to three-dimensionally stack the memory cells MC on the substrate 100 and to form the memory cells MC. In conclusion, a variable resistance memory device may easily increase in integration.

FIGS. 5, 7, 9, 11, 13, and 15 illustrate plan views showing a method of fabricating a variable resistance memory device according to some example embodiments of the present inventive concepts. FIGS. 6A, 8A, 10A, 12A, 14A, and 16A illustrate cross-sectional views taken along line A-A' of FIGS. 5, 7, 9, 11, 13, and 15, respectively. FIGS. 10B, 12B, 14B, and 16B illustrate cross-sectional views taken along line B-B' of FIGS. 9, 11, 13, and 15, respectively. FIGS. 10C, 12C, 14C, and 16C illustrate cross-sectional views taken along line C-C' of FIGS. 9, 11, 13, and 15, respectively.

Figure 6A:
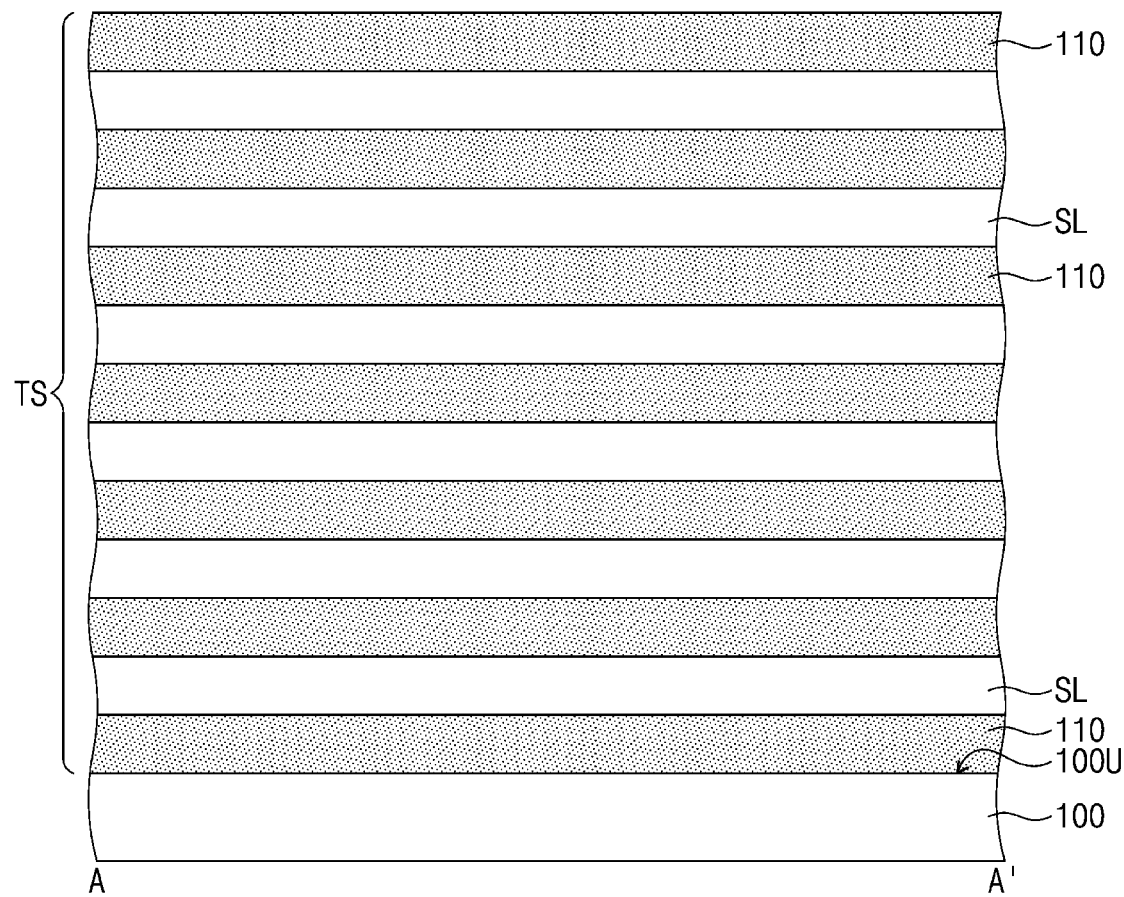
FIGS. 6A, 8A, 10A, 12A, 14A, and 16A illustrate cross-sectional views taken along line A-A' of FIGS. 5, 7, 9, 11, 13, and 15, respectively.
Figure 6B:
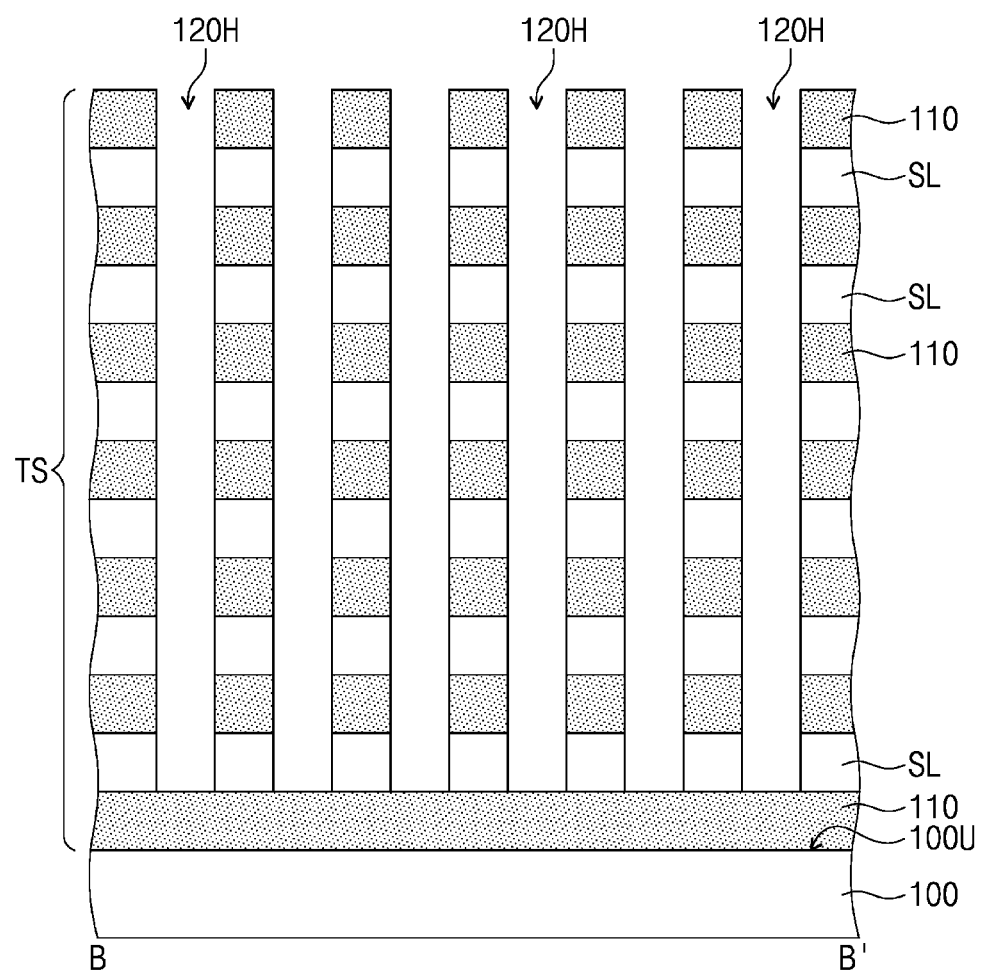

Referring to FIGS. 5, 6A, and 6B, a thin-layer structure TS may be formed on a substrate 100. The thin-layer structure TS may include dielectric layers 110 and semiconductor layers SL that are stacked on a top surface 100U of the substrate 100. The dielectric layers 110 and the semiconductor layers SL may be alternately and repeatedly stacked in the third direction D3 perpendicular to the top surface 100U of the substrate 100. A lowermost one of the dielectric layers 110 may be interposed between the substrate 100 and a lowermost one of the semiconductor layers SL, but the present inventive concepts are not limited thereto. The semiconductor layers SL may include, for example, silicon, germanium, silicon-germanium, or indium gallium zinc oxide (IGZO). The dielectric layers 110 may include a material having an etch selectivity with respect to the semiconductor layers SL. The dielectric layers 110 may include, for example, silicon nitride.

Vertical holes 120H may be formed in the thin-layer structure TS. Each of the vertical holes 120H may penetrate the thin-layer structure TS. Each of the vertical holes 120H may expose a top surface of the lowermost dielectric layer 110, but the present inventive concepts are not limited thereto. The vertical holes 120H may be spaced apart from each other in the first direction D1 within the thin-layer structure TS, and may each have a linear shape extending in the second direction D2.

Figure 8A:
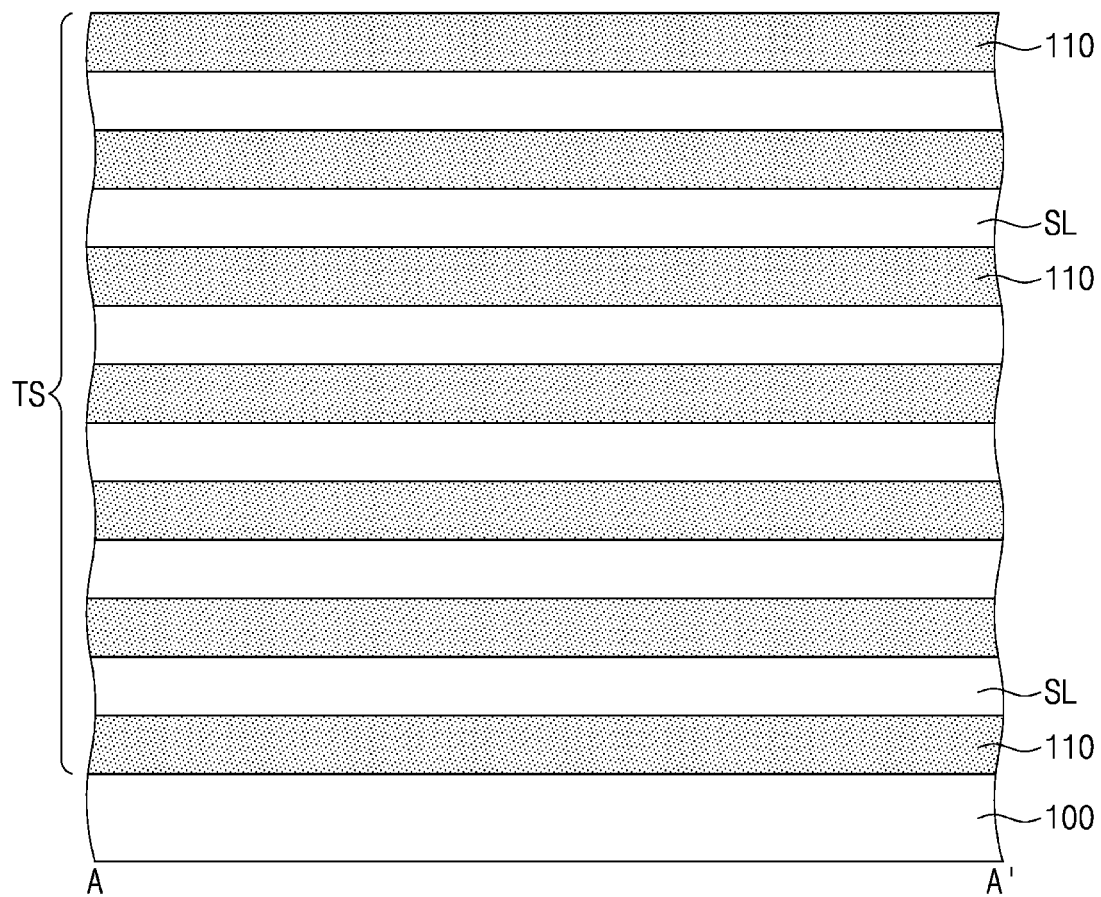
Figure 8B:
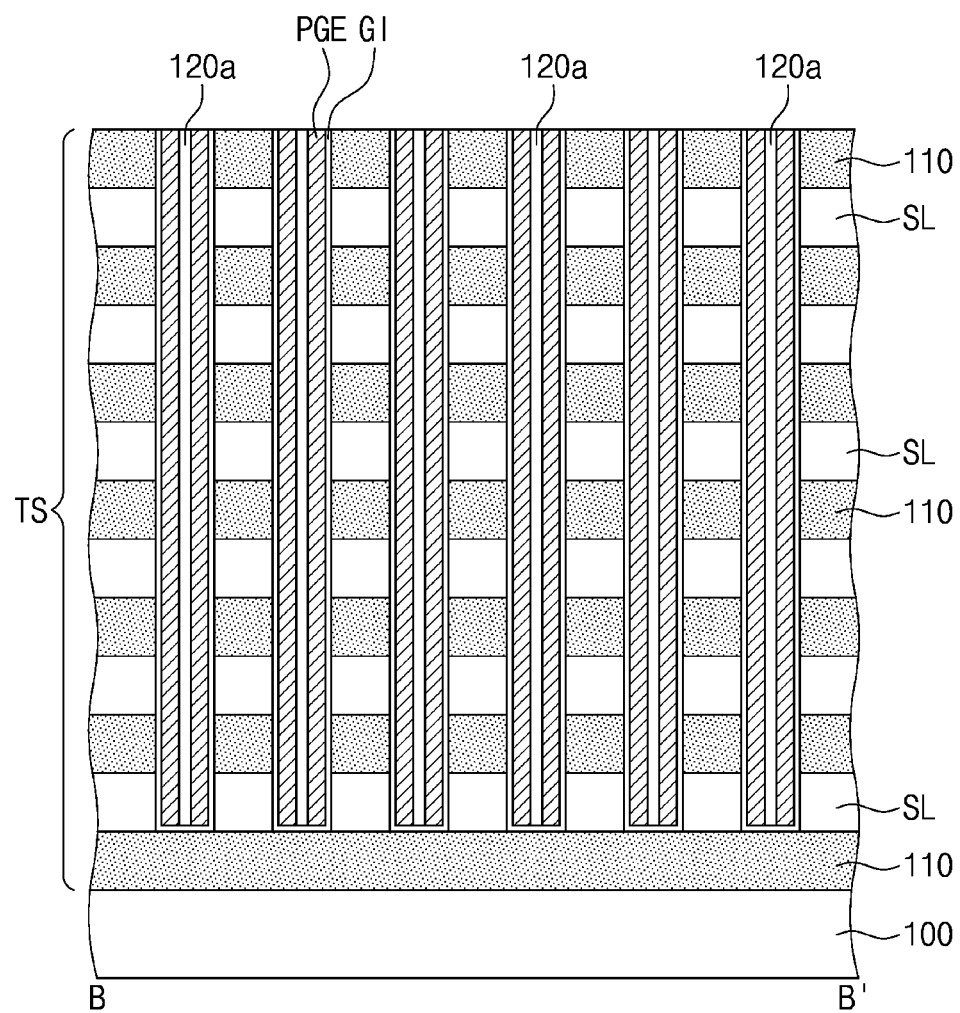
Figure 9:
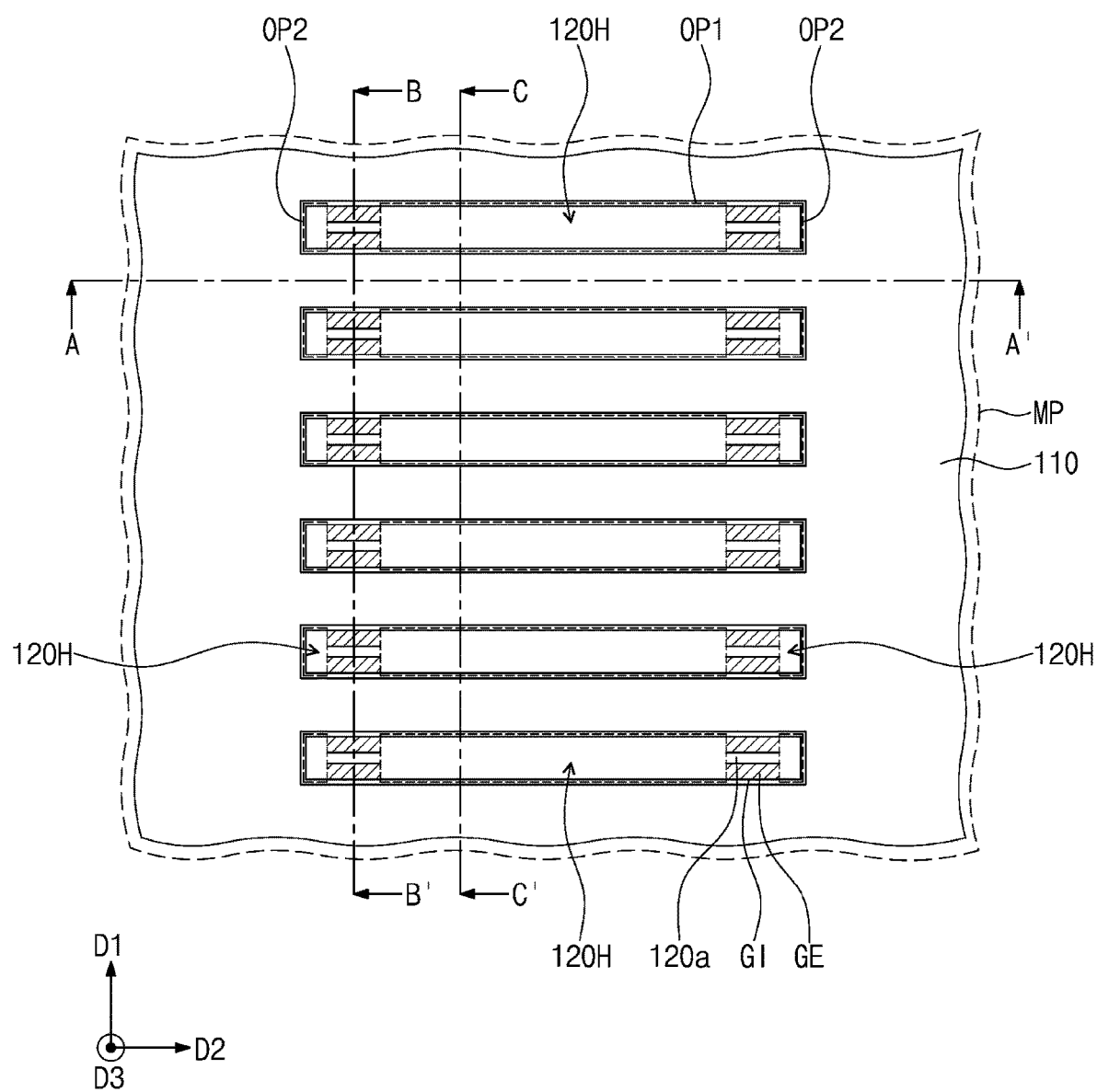
Figure 10A:
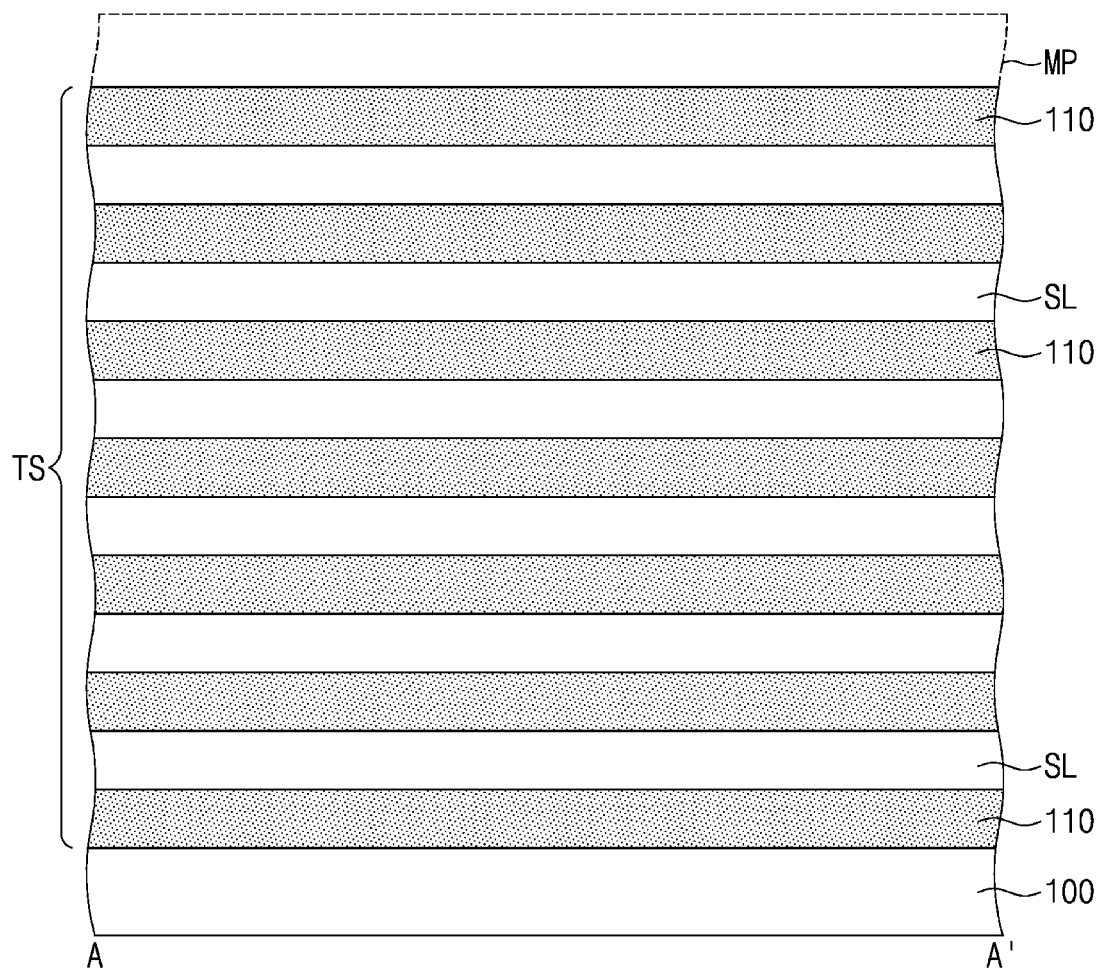
Figure 10B:
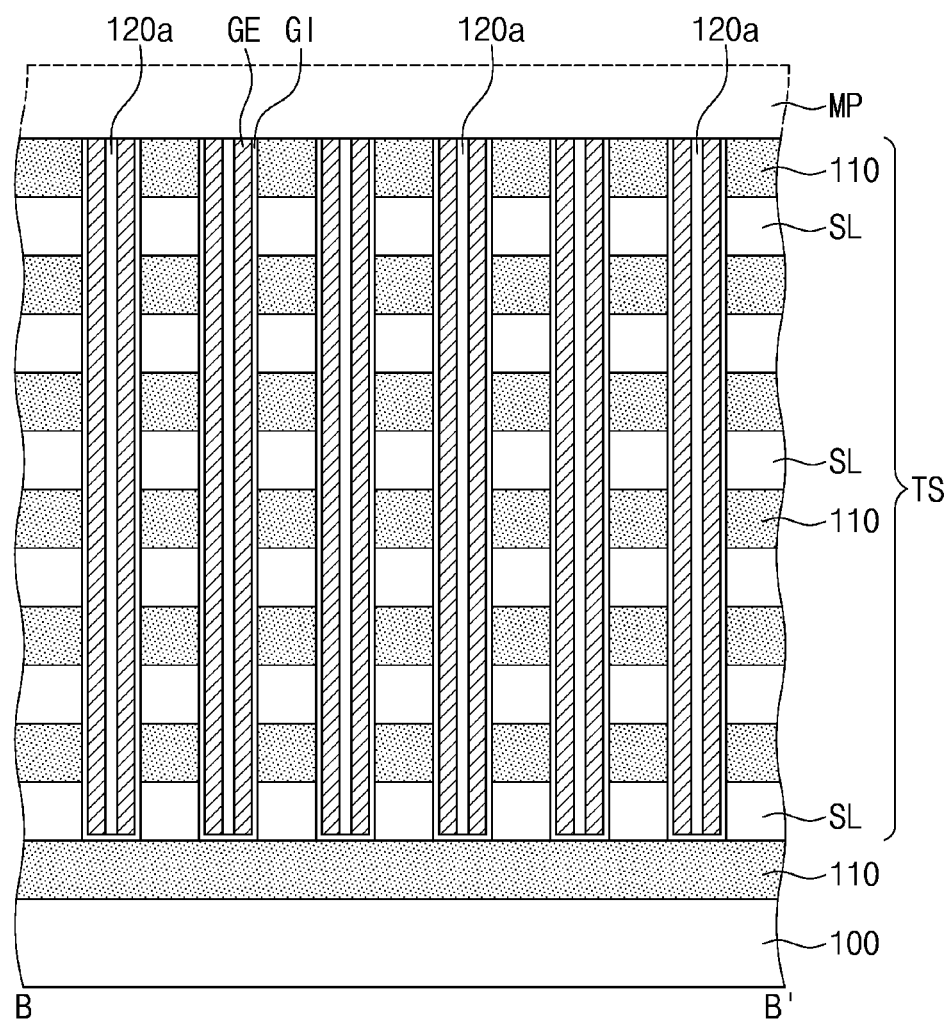
Figure 10C:
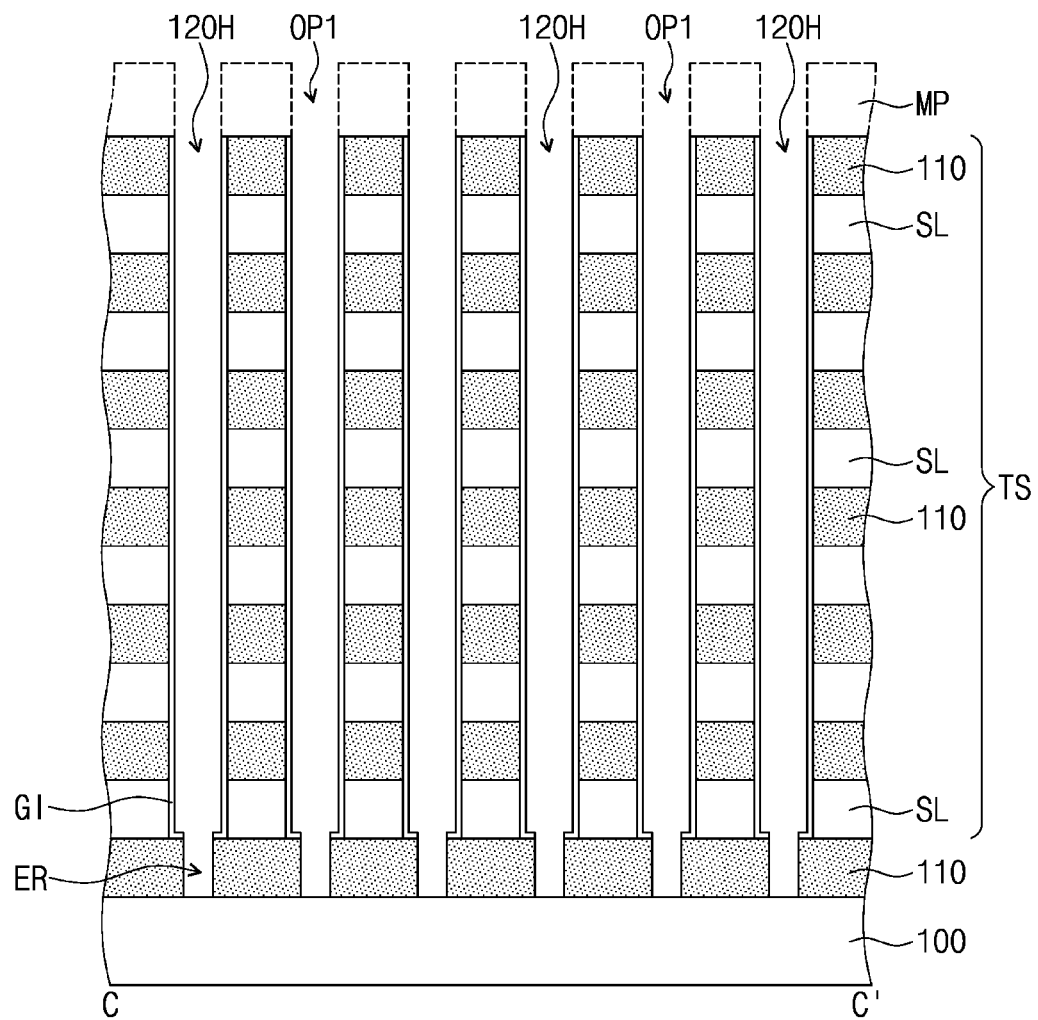
Figure 11:
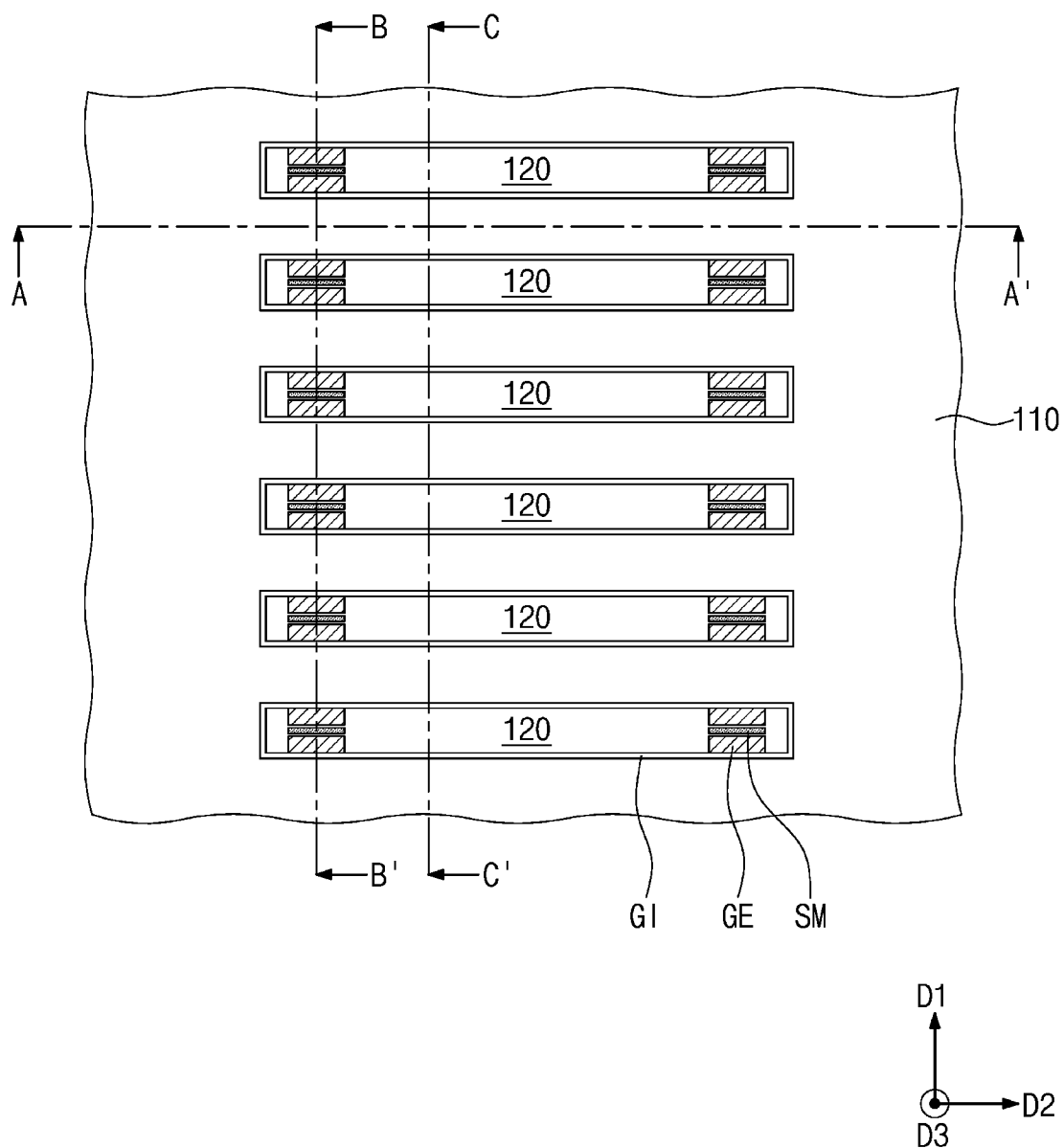
Figure 12A:
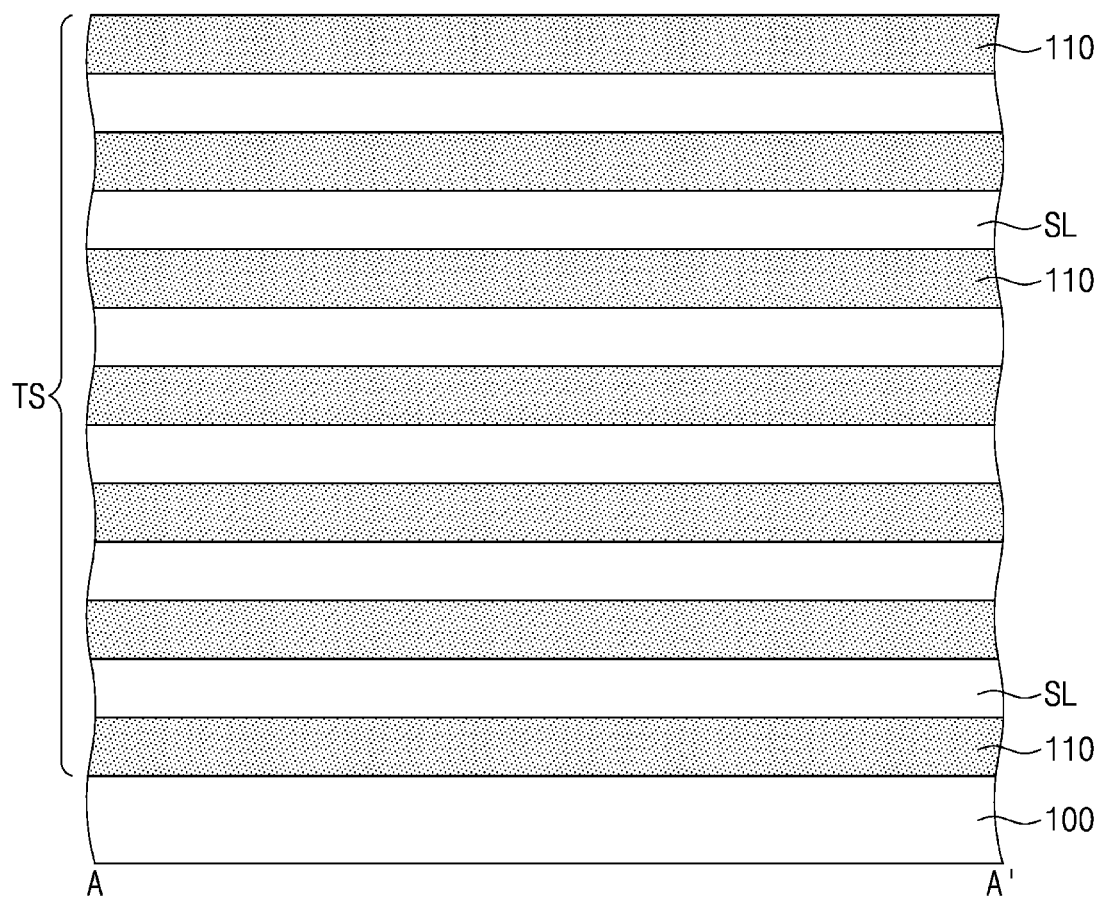
Figure 12C:
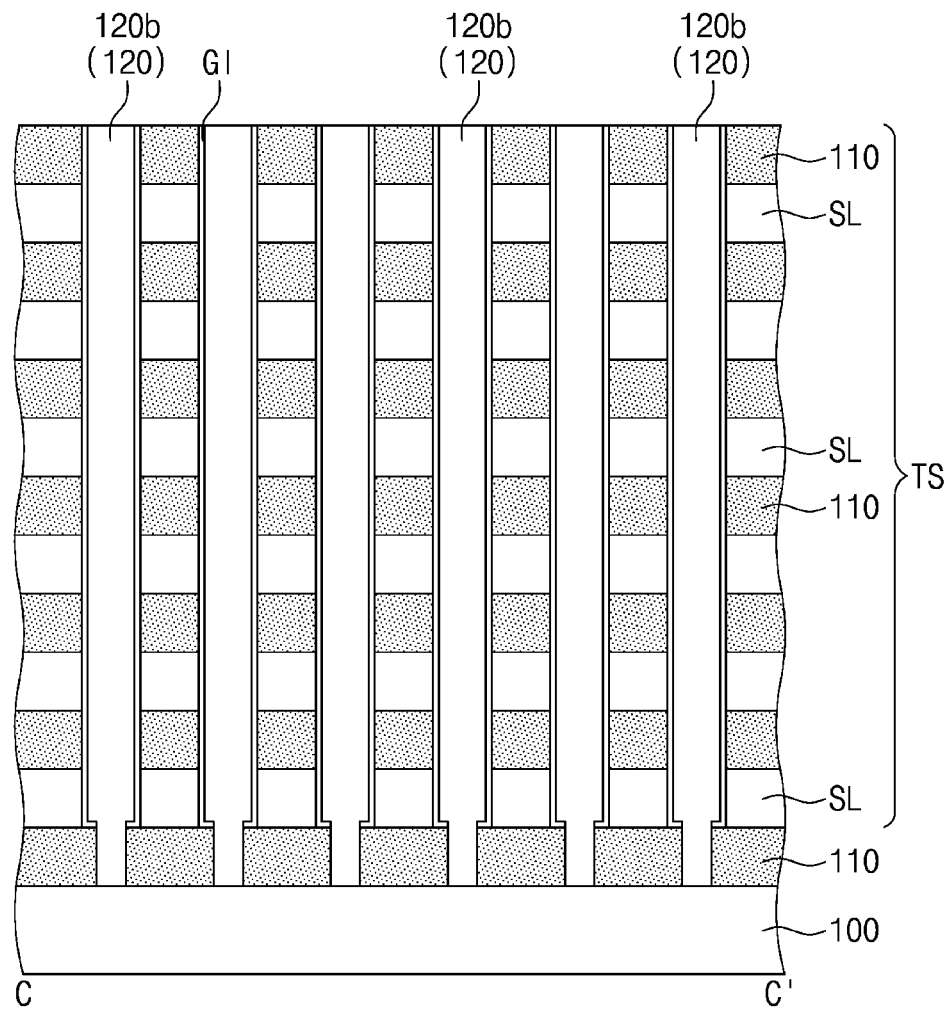
Figure 13:
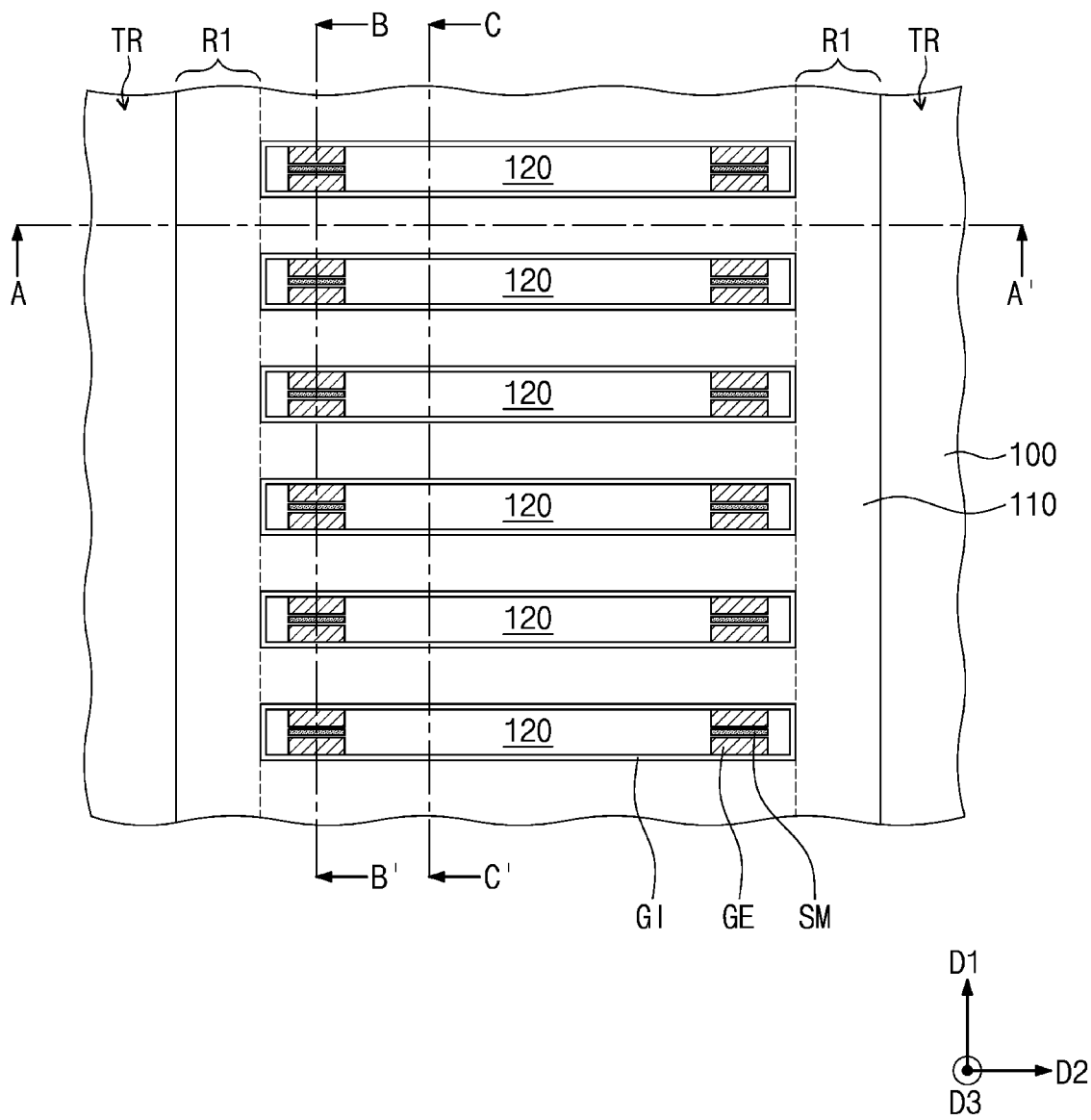
Figure 14A:
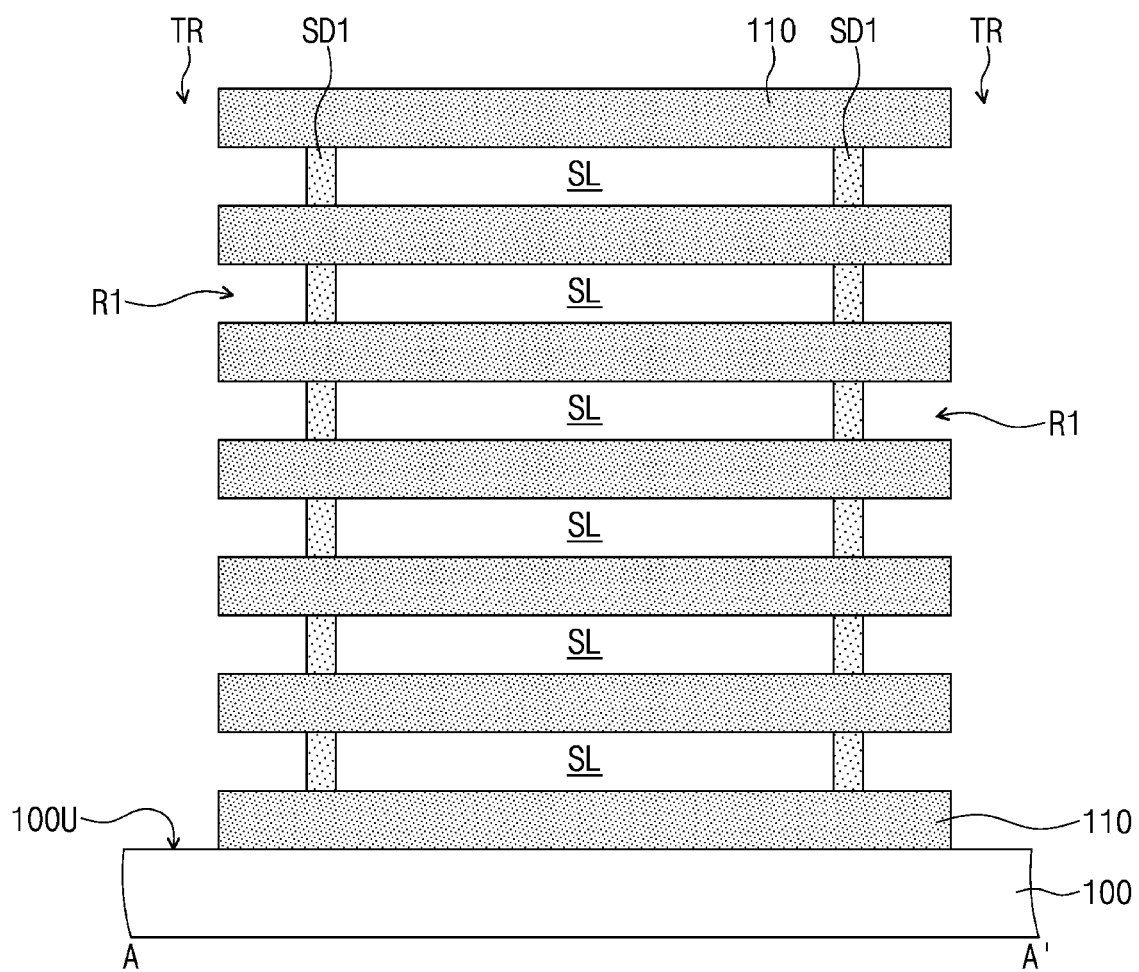
Figure 14B:
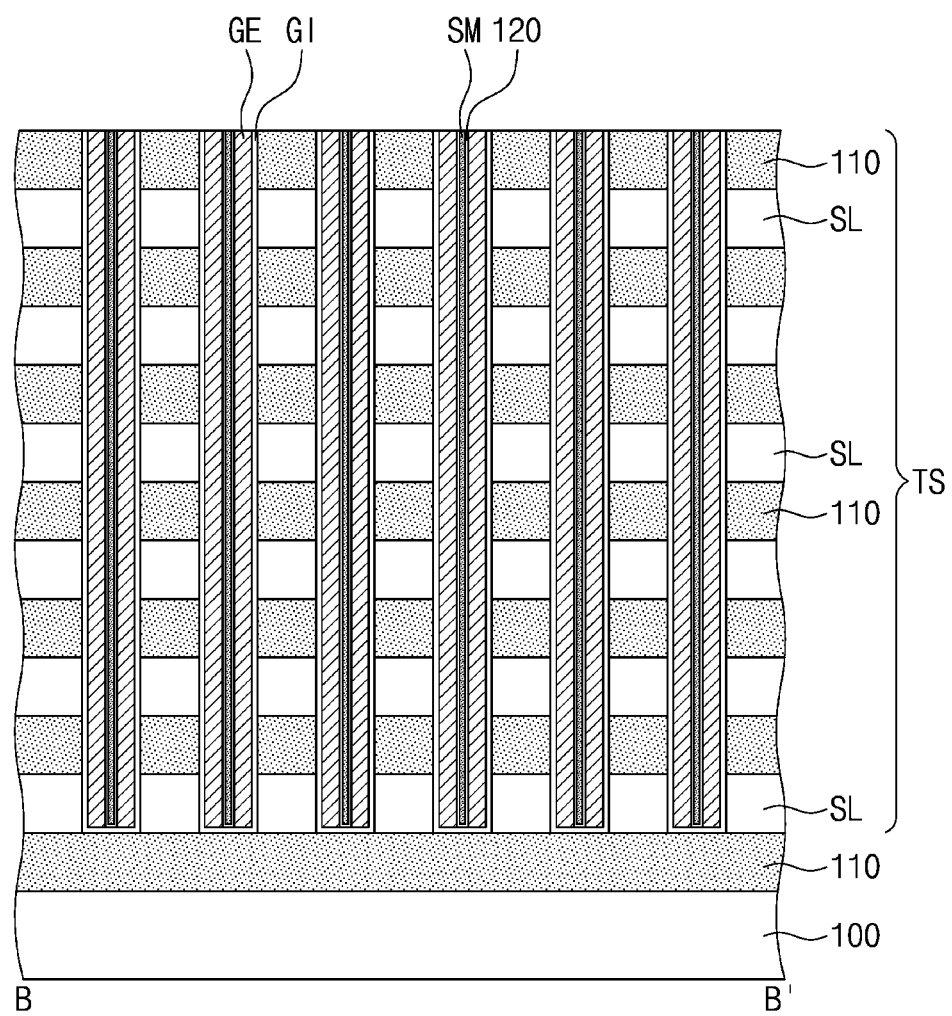
Figure 15:
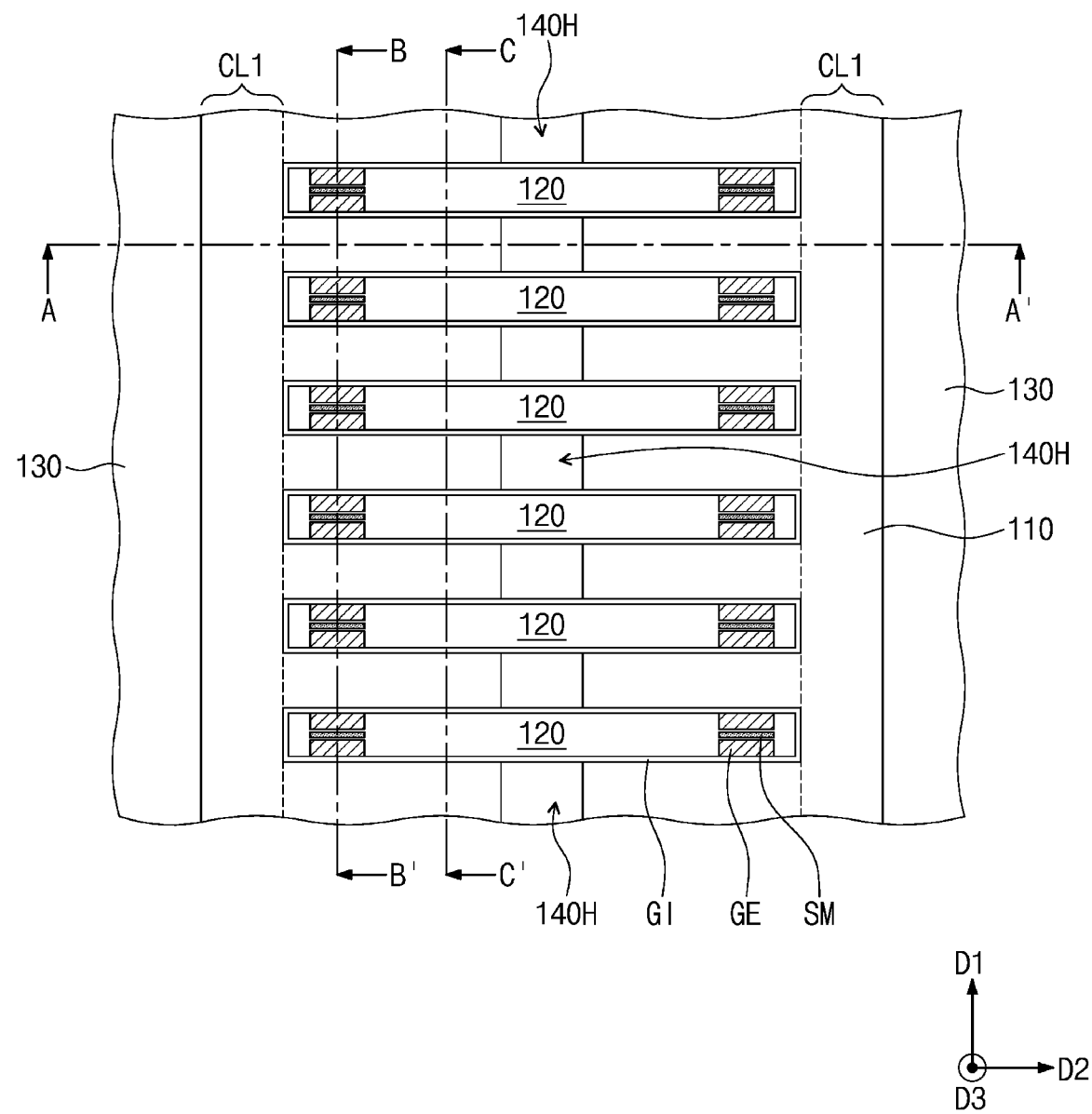
Figure 16A:
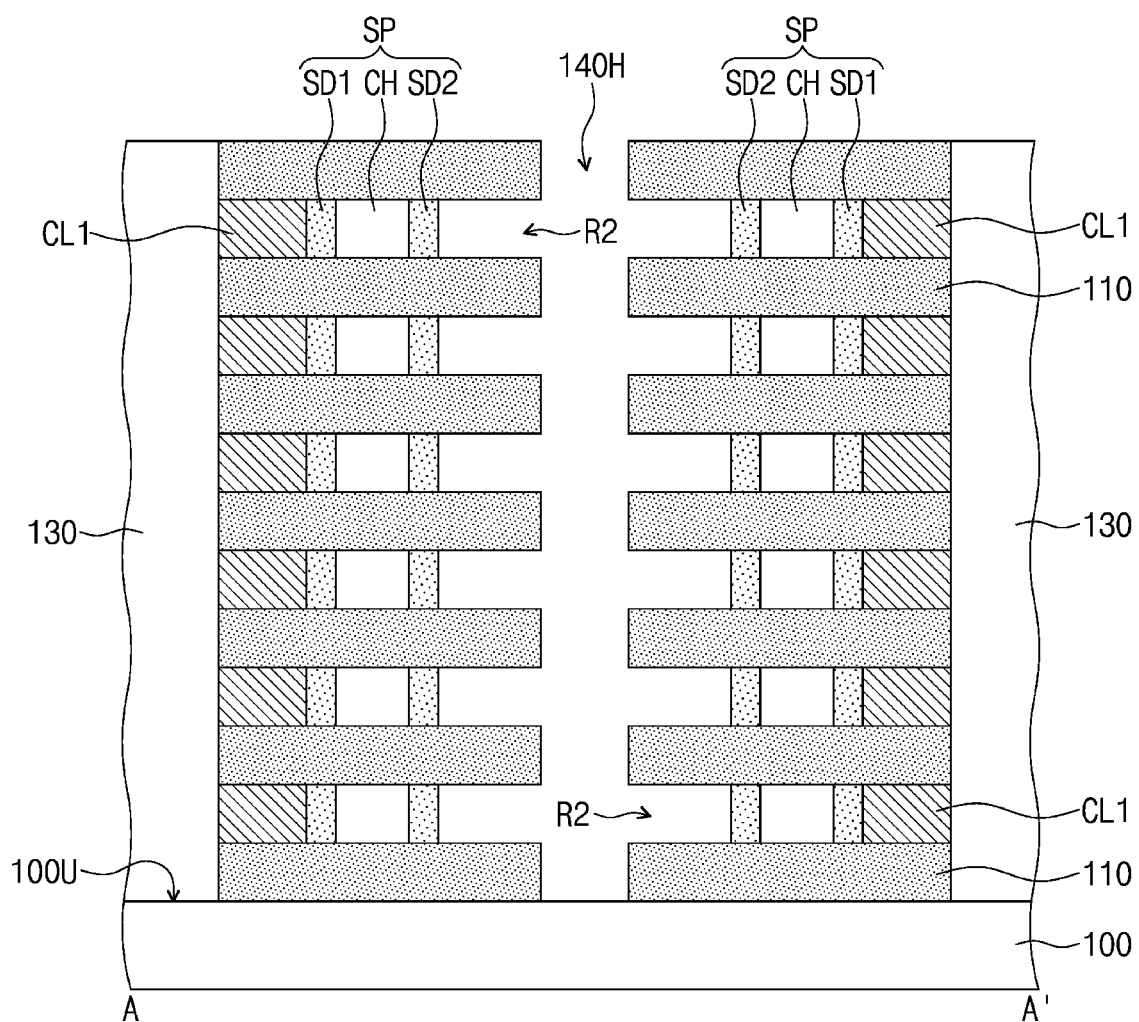
Figure 16B:
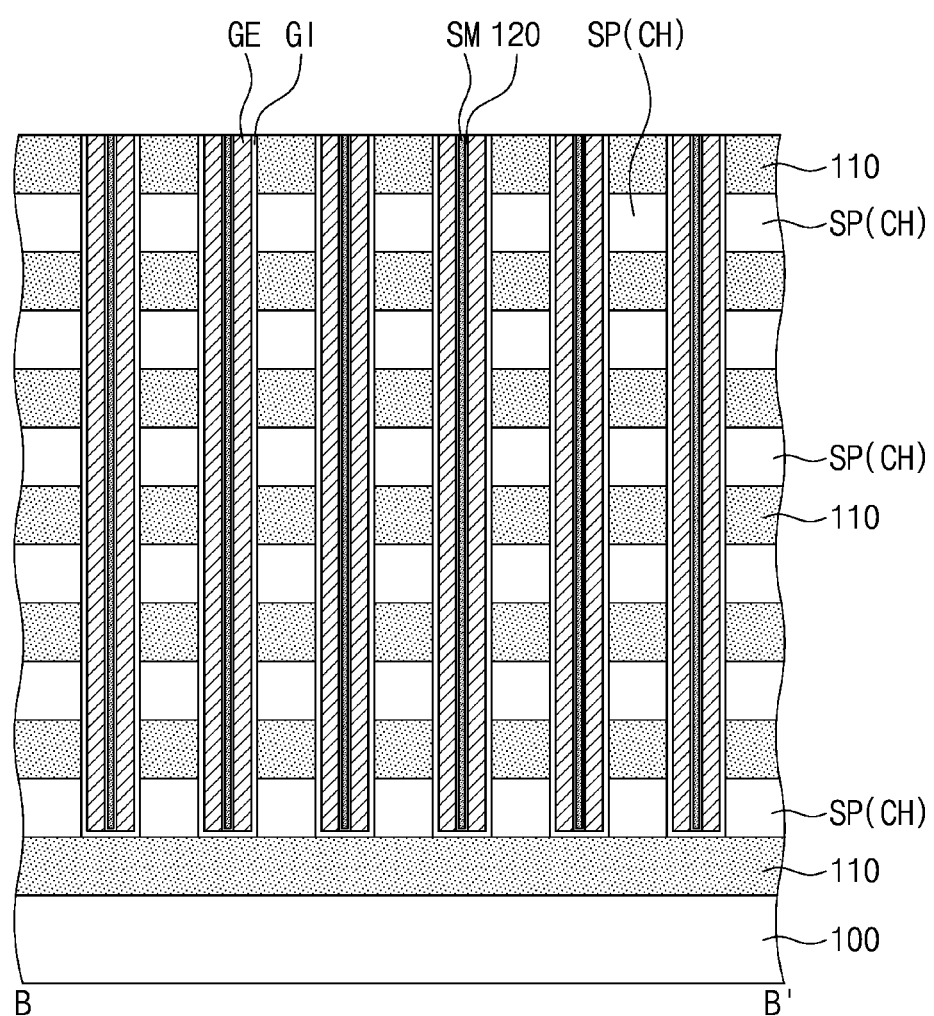
Figure 16C:
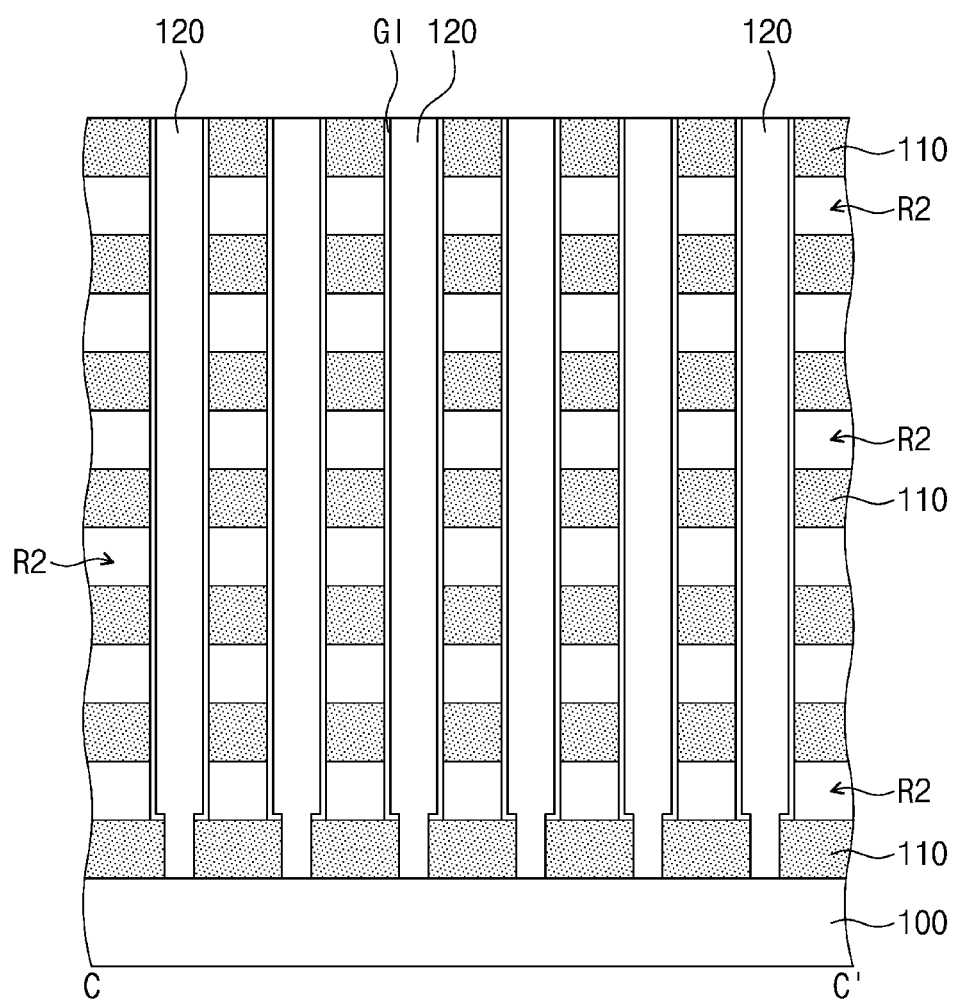

Referring to FIGS. 7, 8A, and 8B, a gate dielectric layer GI may be formed to have a substantially uniform thickness that covers an inner surface of each of the vertical holes 120H. The gate dielectric layer GI may include one or more of a high-k dielectric layer, a silicon oxide layer, a silicon oxynitride layer, and a silicon oxynitride layer. A preliminary gate electrode PGE may be formed in each of the vertical holes 120H. The preliminary gate electrode PGE may be formed to partially fill each of the vertical holes 120H and to have a substantially uniform thickness that covers the inner surface of each of the vertical holes 120H. The gate dielectric layer GI may be interposed between the preliminary gate electrode PGE and the inner surface of each of the vertical holes 120H, while covering a bottom surface of each of the vertical holes 120H. The formation of the preliminary gate electrode PGE may include forming a gate electrode layer on the gate dielectric layer GI to partially fill each of the vertical holes 120H and anisotropically etching the gate electrode layer. The gate electrode layer may include one or more of metal (tungsten, titanium, tantalum, etc.) and conductive metal nitride (titanium nitride, tantalum nitride, etc.).

After the preliminary gate electrode PGE is formed, a first dielectric layer 120a may be formed to fill a remaining portion of each of the vertical holes 120H. The first dielectric layer 120a may include one or more of silicon oxide, silicon nitride, and silicon oxynitride.

Referring to FIGS. 9, 10A, 10B, and 10C, a mask pattern MP may be formed on the thin-layer structure TS. The mask pattern MP may include a first opening OP1 that has a linear shape extending in the second direction D2 and second openings OP2 that are spaced apart in the second direction D2 from each other across the first opening OP1. The first opening OP1 and the second openings OP2 may vertically overlap each of the vertical holes 120H. The first opening OP1 and the second openings OP2 may expose portions of the preliminary gate electrode PGE and portions of the first dielectric layer 120a that are formed in each of the vertical holes 120H. An anisotropic etching process may be performed to remove the exposed portions of preliminary gate electrode PGE and the exposed portions of the first dielectric layer 120a. The anisotropic etching process may etch the lowermost dielectric layer 110 exposed to each of the vertical holes 120H, and thus the lowermost dielectric layer 110 may be provided therein with an extension hole ER exposing the substrate 100.

As the preliminary gate electrode PGE is etched by the anisotropic etching process, gate electrodes GE may be formed in each of the vertical holes 120H. The gate electrodes GE may include four gate electrodes that are spaced apart from each other in the first and second directions D1 and D2 in each of the vertical holes 120H. The gate electrodes GE may each have a linear shape extending in the third direction D3. After the first dielectric layer 120a is etched by the anisotropic etching process, a portion of the first dielectric layer 120a may remain in each of the vertical holes 120H. The portion of the first dielectric layer 120a may be interposed between the gate electrodes GE that neighbor each other in the first direction D1.

Referring to FIGS. 11, 12A, 12B, and 12C, the mask pattern MP may be removed. Afterwards, a second dielectric layer 120b may be formed to fill a remaining portion of each of the vertical holes 120H. In an example embodiment, the second dielectric layer 120b may be connected to the first dielectric layer 120a in each of the vertical holes 120H. The second dielectric layer 120b and the portion of the first dielectric layer 120a may constitute a vertical dielectric pattern 120, and a plurality of vertical dielectric patterns 120 may be formed in the vertical holes 120H, respectively. Shield lines SM may be formed in the vertical dielectric pattern 120. Each of the shield lines SM may be interposed between the gate electrodes GE that neighbor each other in the first direction D1, and a portion of the vertical dielectric pattern 120 may be interposed between each of the shield lines SM and the gate electrodes GE that neighbor each other in the first direction D1. Each of the shield lines SM may penetrate the vertical dielectric pattern 120 and have a linear shape extending in the third direction D3. The formation of the shield lines SM may include, for example, partially removing the vertical dielectric pattern 120 to form a line hole between the gate electrodes GE that neighbor each other in the first direction D1 and forming a shield layer to fill the line hole. The shield layer may include, for example, metal.

Referring to FIGS. 13, 14A, 14B, and 14C, a pair of trenches TR may be formed to penetrate the thin-layer structure TS. The pair of trenches TR may extend in the first direction D1 and be spaced apart from each other in the second direction D2. Each of the pair of trenches TR may expose lateral surfaces of the dielectric layers 110 and lateral surfaces of the semiconductor layers SL, while exposing the top surface 100U of the substrate 100. The formation of the trenches TR may include, for example, forming a mask pattern defining regions on the thin-layer structure TS where the trenches TR are to be formed, and etching the thin-layer structure TS by using the mask pattern as an etching mask.

The lateral surfaces, exposed to each of the trenches TR, of the semiconductor layers SL may be recessed to form first recess regions R1 between the dielectric layers 110. The formation of the first recess regions R1 may include, for example, etching the semiconductor layers SL by performing an etching process having an etch selectivity with respect to the dielectric layers 110, the gate dielectric layer GI, and the substrate 100. For example, the etching process may include an isotropic etching process such as a wet etching and a dry etching process. Etchants may be supplied through the trenches TR to form the first recess regions R1. The first recess regions R1 may horizontally extend from each of the trenches TR. The first recess regions R1 may extend in the first direction D1 and be spaced apart from each other in the third direction D3. Each of the first recess regions R1 may be formed between a pair of dielectric layers 110 that neighbor each other in the third direction D3. Each of the first recess regions R1 may extend in the first direction D1 to expose the gate dielectric layer GI on lateral surfaces of the vertical dielectric patterns 120 and also to expose lateral surfaces of the semiconductor layers SL between the vertical dielectric patterns 120. Impurities may be doped into portions of the semiconductor layers SL exposed to the first recess regions R1. Therefore, a first impurity region SD1 may be formed on a side of each of the semiconductor layers SL.

Referring to FIGS. 15, 16A, 16B, and 16C, after the first impurity region SD1 is formed, first conductive lines CL1 may be formed in corresponding first recess regions R1. The formation of the first conductive lines CL1 may include, for example, forming a first conductive layer on the thin-layer structure TS to fill the first recess regions R1 and at least portions of the trenches TR and removing the first conductive layer from the trenches TR. The first conductive layer may include one or more of metal (e.g., copper, tungsten, or aluminum) and metal nitride (e.g., tantalum nitride, titanium nitride, or tungsten nitride). The removal of the first conductive layer may include etching the first conductive layer until a top surface of the thin-layer structure TS and an inner surface of each of the trenches TR are exposed. As the first conductive layer is etched, the first conductive lines CL1 may be locally formed in the first recess regions R1. In an example embodiment, the first conductive layer may be anisotropically etched to locally form the first conductive lines CL1 in the first recess regions R1. Each of the first conductive lines CL1 may extend in the first direction D1 to contact a lateral surface of the first impurity region SD1 that is between the vertical dielectric patterns 120.

Isolation dielectric patterns 130 may be formed in corresponding trenches TR. The formation of the isolation dielectric patterns 130 may include, for example, forming an isolation dielectric layer on the thin-layer structure TS to fill the trenches TR and performing a planarization process on the isolation dielectric layer until the top surface of the thin-layer structures TS is exposed. The isolation dielectric patterns 130 may be locally formed in the trenches TR by the planarization process. The isolation dielectric patterns 130 may extend in the first direction D1 and be spaced apart in the second direction D2 from each other across the first conductive lines CL1. The isolation dielectric patterns 130 may include, for example, one or more of oxide, nitride, and oxynitride.

Holes 140H may be formed to penetrate the thin-layer structure TS. The holes 140H may be spaced apart from each other in the first direction D1 between the isolation dielectric patterns 130. The holes 140H and the vertical dielectric patterns 120 may be alternately arranged in the first direction D1. Each of the holes 140H may expose lateral surfaces of the dielectric layers 110 and lateral surfaces of the semiconductor layers SL of the thin-layer structure TS, while exposing the top surface 100U of the substrate 100. The formation of the holes 140H may include, for example, forming on the thin-layer structure TS a mask pattern defining regions where the holes 140H are to be formed and etching the thin-layer structure TS by using the mask pattern as an etching mask.

The lateral surfaces, exposed to each of the holes 140H, of the semiconductor layers SL may be recessed to form second recess regions R2 between the dielectric layers 110. The formation of the second recess regions R2 may include, for example, etching the semiconductor layers SL by performing an etching process having an etch selectivity with respect to the dielectric layers 110, the gate dielectric layer GI, and the substrate 100. For example, the etching process may include an isotropic etching process such as a wet etching and a dry etching process. Etchants may be supplied through the holes 140H to form the second recess regions R2. The second recess regions R2 may horizontally extend from each of the holes 140H. Each of the second recess regions R2 may be formed between a pair of dielectric layers 110 that neighbor each other in the third direction D3 and between a pair of vertical dielectric patterns 120 that neighbor each other in the first direction D1. Impurities may be doped into portions of the semiconductor layers SL exposed to the second recess regions R2. Therefore, a second impurity region SD2 may be formed on a side of each of the semiconductor layers SL. A portion of each of the semiconductor layers SL may remain between the first impurity region SD1 and the second impurity region SD2. The portion of each of the semiconductor layers SL may be referred to a channel region CH. A semiconductor pattern SP may be constituted by the first impurity region SD1, the second impurity region SD2, and the channel region CH between the first and second impurity regions SD1 and SD2.

Referring back to FIGS. 3, 4A, 4B, and 4C, an electrode EP may be formed on a side of the semiconductor pattern SP. The side thereof is exposed to the second recess region R2. The formation of the electrode EP may include forming an electrode layer on the thin-layer structure TS to fill the second recess regions R2 and at least a portion of each of the holes 140H, removing the electrode layer from each of the holes 140H, and recessing the electrode layer until the electrode layer remains to have a predetermined thickness in each of the second recess regions R2. Thereafter, a variable resistance element VR may be formed in each of the second recess regions R2. The formation of the variable resistance element VR may include forming a variable resistance material layer on the thin-layer structure TS to fill the second recess regions R2 and at least a portion of each of the holes 140H and removing the variable resistance material layer from each of the holes 140H. The removal of the variable resistance material layer may include etching the variable resistance material layer until an inner surface of each of the holes 140H is exposed. Accordingly, the variable resistance element VR may be locally formed in each of the second recess regions R2.

The semiconductor pattern SP, the electrode EP, and the variable resistance element VR may be horizontally arranged in a parallel direction (e.g., the second direction D2) to the top surface 100U of the substrate 100. The semiconductor pattern SP, the electrode EP, and the variable resistance element VR may constitute a memory cell MC.

Figure 17:
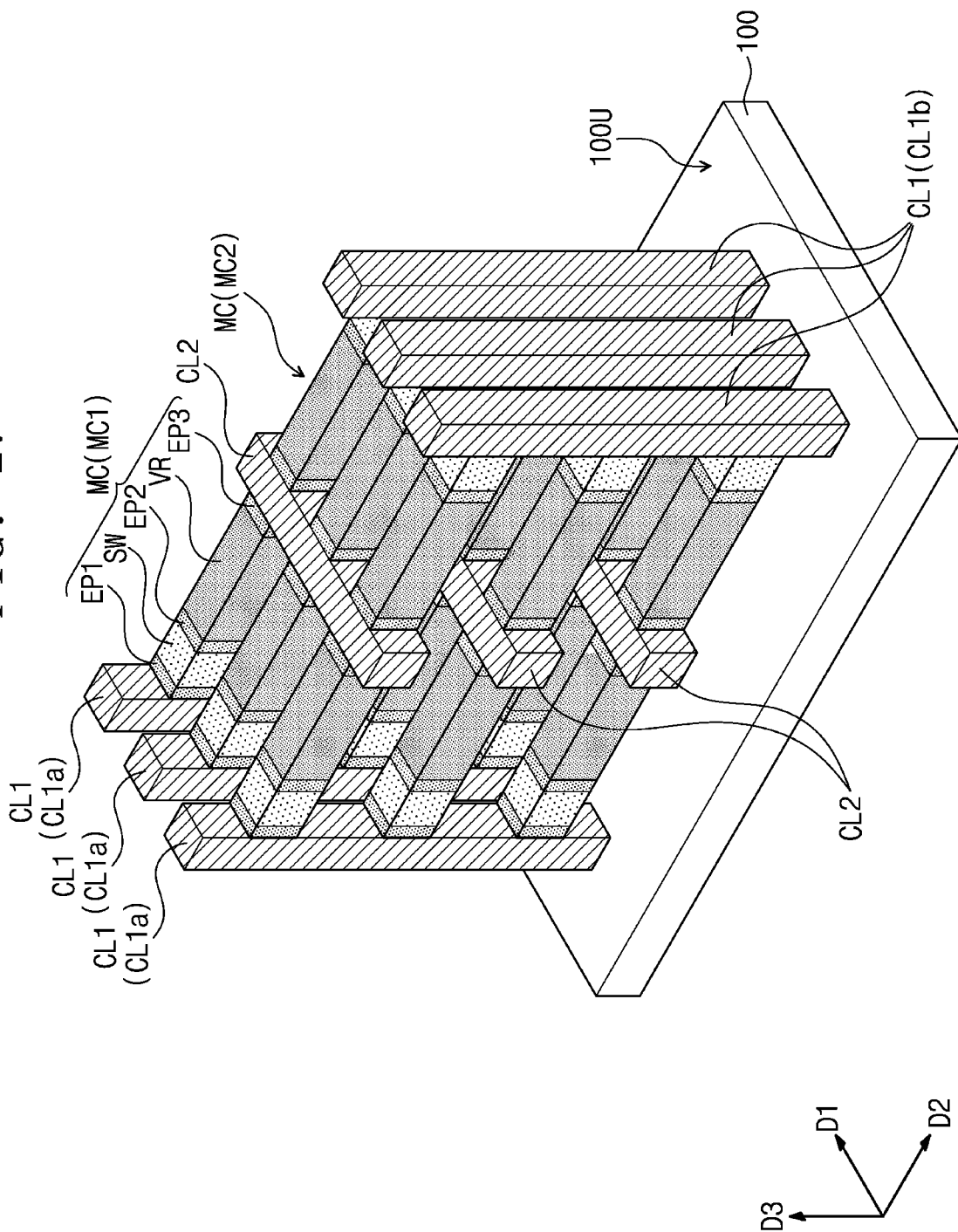
FIG. 17 illustrates a simplified perspective view showing a variable resistance memory device according to some example embodiments of the present inventive concepts.
Figure 18A:
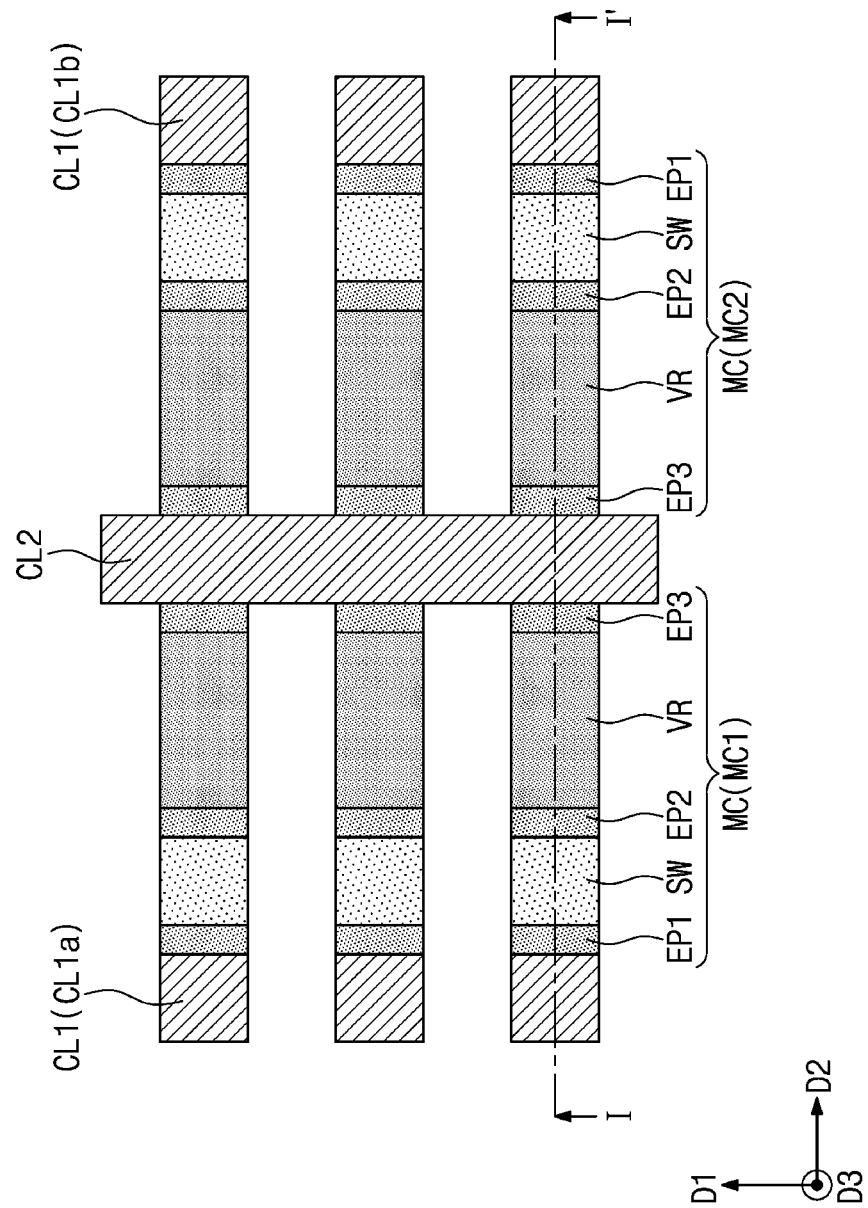
FIG. 18A illustrates a plan view showing the variable resistance memory device of FIG. 17.
Figure 18B:
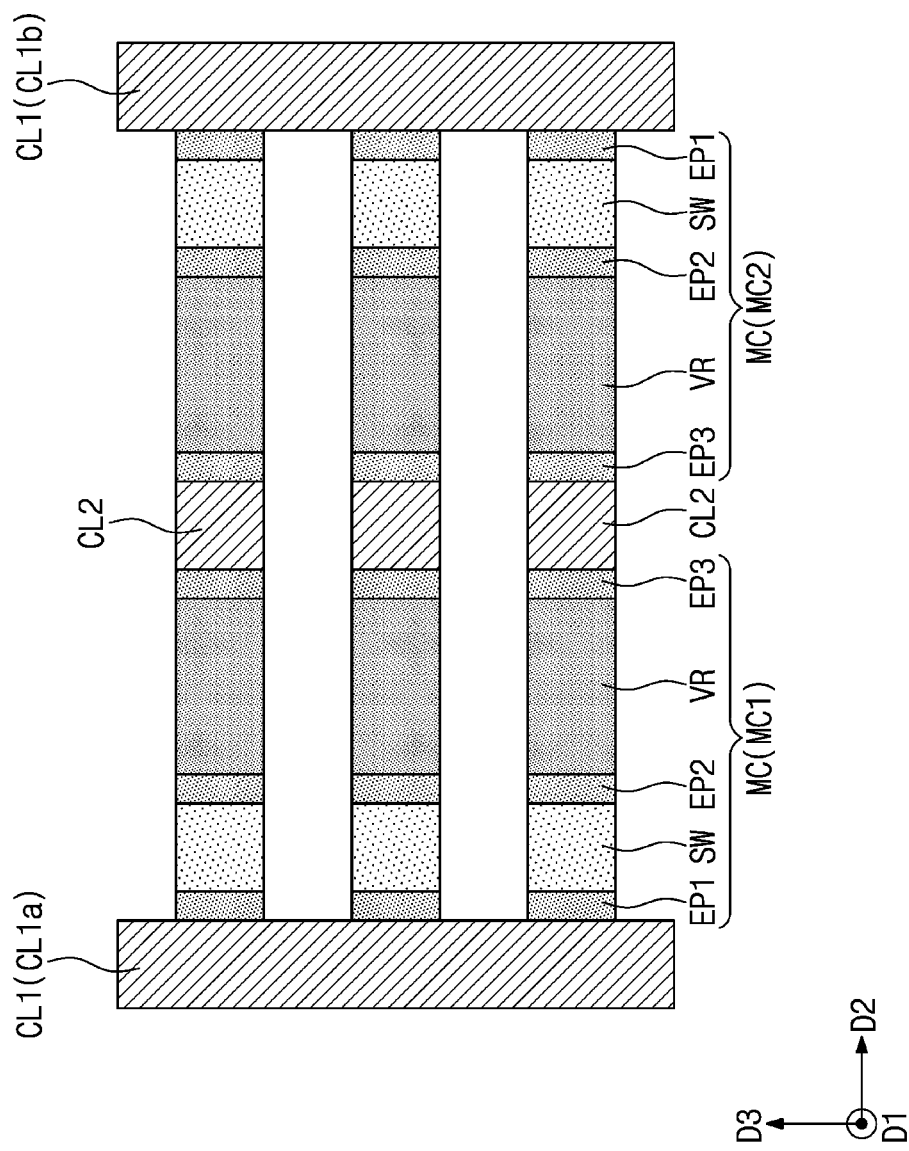
FIG. 18B illustrates a cross-sectional view taken along line I-I' of FIG. 18A.

FIG. 17 illustrates a simplified perspective view showing a variable resistance memory device according to some example embodiments of the present inventive concepts. FIG. 18A illustrates a plan view showing the variable resistance memory device of FIG. 17. FIG. 18B illustrates a cross-sectional view taken along line I-I' of FIG. 18A. The following will mainly describe differences from the variable resistance memory device discussed with reference to FIGS. 1, 2A, and 2B.

Referring to FIGS. 17, 18A, and 18B, the substrate 100 may be provided thereon with the first conductive lines CL1 and the second conductive lines CL2 running across the first conductive lines CL1. The first conductive lines CL1 may extend in the third direction D3 perpendicular to the top surface 100U of the substrate 100 and be spaced apart from each other in the first direction D1 parallel to the top surface 100U of the substrate 100. The second conductive lines CL2 may extend in the first direction D1 and be spaced apart from each other in the third direction D3. The first conductive lines CL1 may include the first sub-conductive lines CL1a provided on sides of the second conductive lines CL2 and also include the second sub-conductive lines CL1b provided on opposite sides of the second conductive lines CL2. The second sub-conductive lines CL1b may be spaced apart from the first sub-conductive lines CL1a in the second direction D2 that is parallel to the top surface 100U of the substrate 100 and different from the first direction D1. The second conductive lines CL2 may be disposed between the first sub-conductive lines CL1a and the second sub-conductive lines CL1b.

The memory cells MC may be disposed at intersections between the first conductive lines CL1 and the second conductive lines CL2. For example, each of the memory cells MC may be disposed at an intersection between a corresponding one of the first conductive lines CL1 and a corresponding one of the second conductive lines CL2. The memory cells MC may include the first memory cells MC1 at corresponding intersections between the first sub-conductive lines CL1a and the second conductive lines CL2 and also include the second memory cells MC2 at corresponding intersections between the second sub-conductive lines CL1b and the second conductive lines CL2. The first memory cells MC1 may be spaced apart from each other in the first and third directions D1 and D3 between the first sub-conductive lines CL1a and the second conductive lines CL2. Each of the first memory cells MC1 may be connected to a corresponding first sub-conductive line CL1a and a corresponding second conductive line CL2. The second memory cells MC2 may be spaced apart from each other in the first and third directions D1 and D3 between the second sub-conductive lines CL1b and the second conductive lines CL2. Each of the second memory cells MC2 may be connected to a corresponding second sub-conductive line CL1b and a corresponding second conductive line CL2. The second memory cells MC2 may be spaced apart in the second direction D2 from the first memory cells MC1.

Each of the memory cells MC may include the variable resistance element VR and the select element SW. The variable resistance element VR and the select element SW may be horizontally arranged in the second direction D2. The variable resistance element VR and the select element SW that are included in each of the first memory cells MC1 may be connected in series between a corresponding first sub-conductive line CL1a and a corresponding second conductive line CL2. The variable resistance element VR and the select element SW that are included in each of the second memory cells MC2 may be connected in series between a corresponding second sub-conductive line CL1b and a corresponding second conductive line CL2.

Each of the first memory cell MC1 and its corresponding second memory cell MC2 may be symmetric with each other about a corresponding second conductive line CL2. In an example embodiment, each of the first memory cell MC1, the corresponding second memory cell MC2 and the corresponding first conductive line CL1 may be positioned at the same level in the third direction D3 from the top surface 100U of the substrate 100. For example, the variable resistance element VR of each of the first memory cells MC1 and the variable resistance element VR of each of the second memory cells MC2 may be connected in common to the corresponding second conductive line CL2, and the select element SW of each of the first memory cells MC1 and the select element SW of each of the second memory cells MC2 may be connected respectively to the corresponding first sub-conductive line CL1a and the corresponding second sub-conductive line CL1b.

Each of the memory cells MC may further include a first electrode EP1 between the select element SW and the first conductive line CL1, a second electrode EP2 between the variable resistance element VR and the select element SW, and a third electrode EP3 between the variable resistance element VR and the second conductive line CL2. The first, second, and third electrodes EP1, EP2, and EP3 may include metal, for example, one or more of W, Ti, Al, Cu, C, CN, TiN, TiAlN, TiSiN, TiCN, WN, CoSiN, WSiN, TaN, TaCN, TaSiN, and TiO. The select element SW may be either a diode or a device operating based on a threshold switching phenomenon and may have a nonlinear I-V curve (e.g., S-type I-V curve). For example, the select element SW may be an OTS (Ovonic Threshold Switch) device having bidirectional characteristics. In an example embodiment, the OTS device may be a bidirectional switch.

Figure 19:
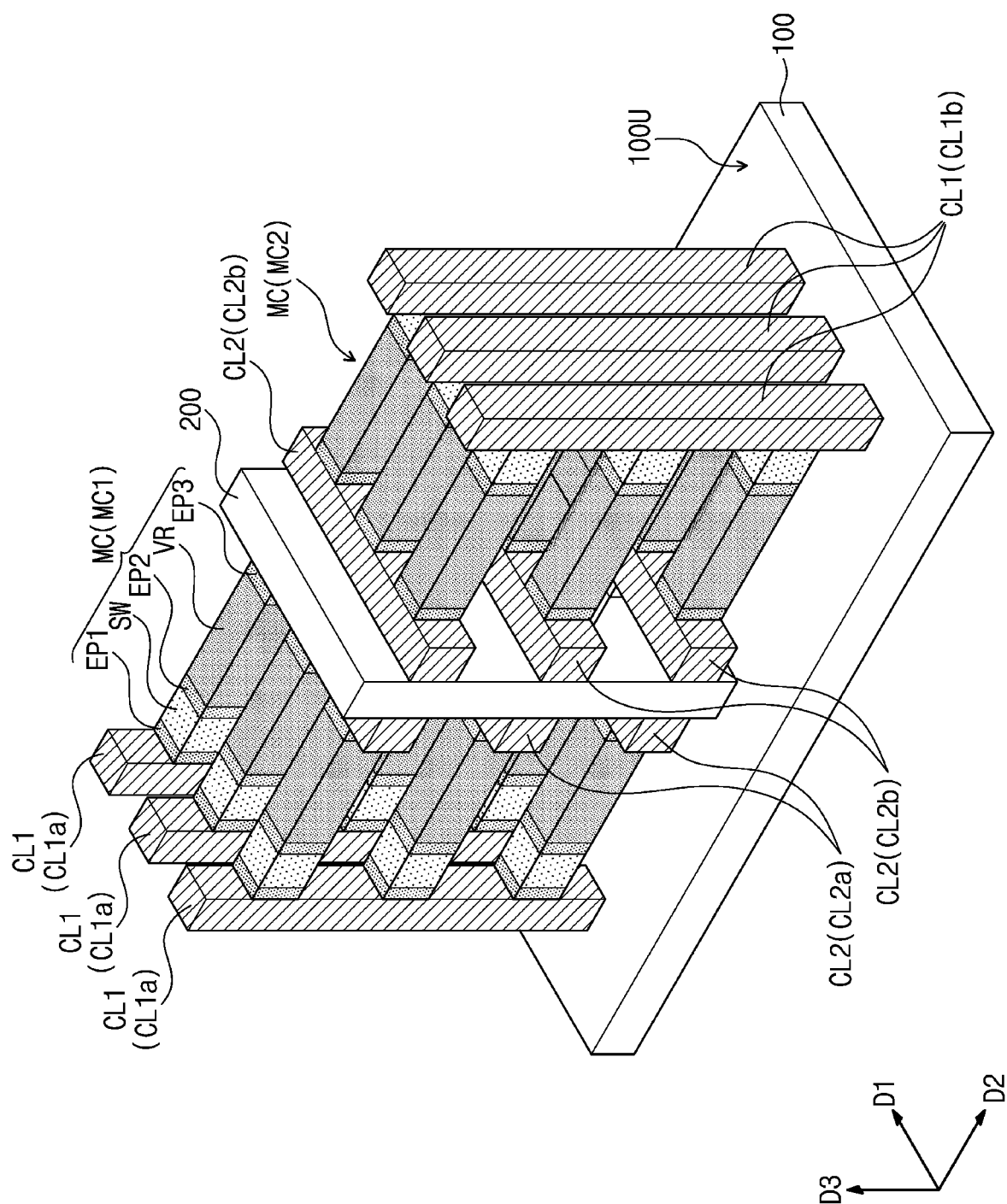
FIG. 19 illustrates a simplified perspective view showing a variable resistance memory device according to some example embodiments of the present inventive concepts.
Figure 20B:
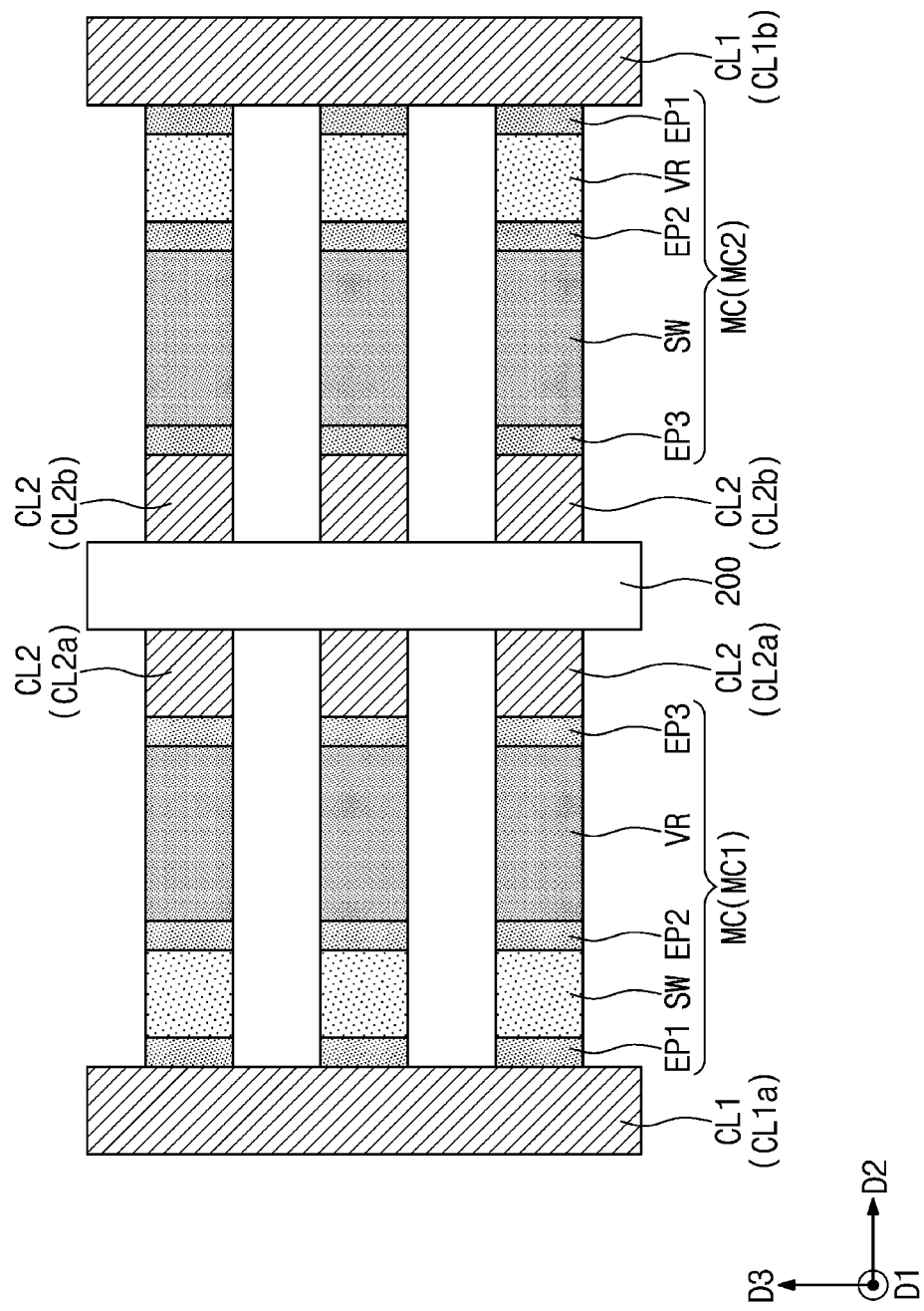
FIG. 20B illustrates a cross-sectional view taken along line I-I' of FIG. 20A.

FIG. 19 illustrates a simplified perspective view showing a variable resistance memory device according to some example embodiments of the present inventive concepts. FIG. 20A illustrates a plan view showing the variable resistance memory device of FIG. 19. FIG. 20B illustrates a cross-sectional view taken along line I-I' of FIG. 20A. The following will mainly describe differences from the variable resistance memory device discussed with reference to FIGS. 17, 18A, and 18B.

Referring to FIGS. 19, 20A, and 20B, according to the present embodiment, the second conductive lines CL2 may include third sub-conductive lines CL2a adjacent to the first sub-conductive lines CL1a and also include fourth sub-conductive lines CL2b adjacent to the second sub-conductive lines CL1b. The third sub-conductive lines CL2a may extend in the first direction D1 and be spaced apart from each other in the third direction D3. The fourth sub-conductive lines CL2b may extend in the first direction D1 and be spaced apart from each other in the third direction D3. The fourth sub-conductive lines CL2b may be spaced apart in the second direction D2 from the third sub-conductive lines CL2a across a line dielectric pattern 200. The line dielectric pattern 200 may include, for example, one or more of oxide, nitride, and oxynitride.

The first memory cells MC1 may be provided at corresponding intersections between the first sub-conductive conductive lines CL1a and the third sub-conductive lines CL2a, and the second memory cells MC2 may be provided at corresponding intersections between the second sub-conductive lines CL1b and the fourth sub-conductive lines CL2b. Each of the first memory cells MC1 may be connected to a corresponding first sub-conductive conductive line CL1a and a corresponding third sub-conductive line CL2a, and each of the second memory cells MC2 may be connected to a corresponding second sub-conductive line CL1b and a corresponding fourth sub-conductive line CL2b. The first sub-conductive lines CL1a, the first memory cells MC1, and the third sub-conductive lines CL2a may be disposed symmetrically about the line dielectric pattern 200 with the second sub-conductive lines CL1b, the second memory cells MC2, and the fourth sub-conductive lines CL2b, respectively.

Figure 21:
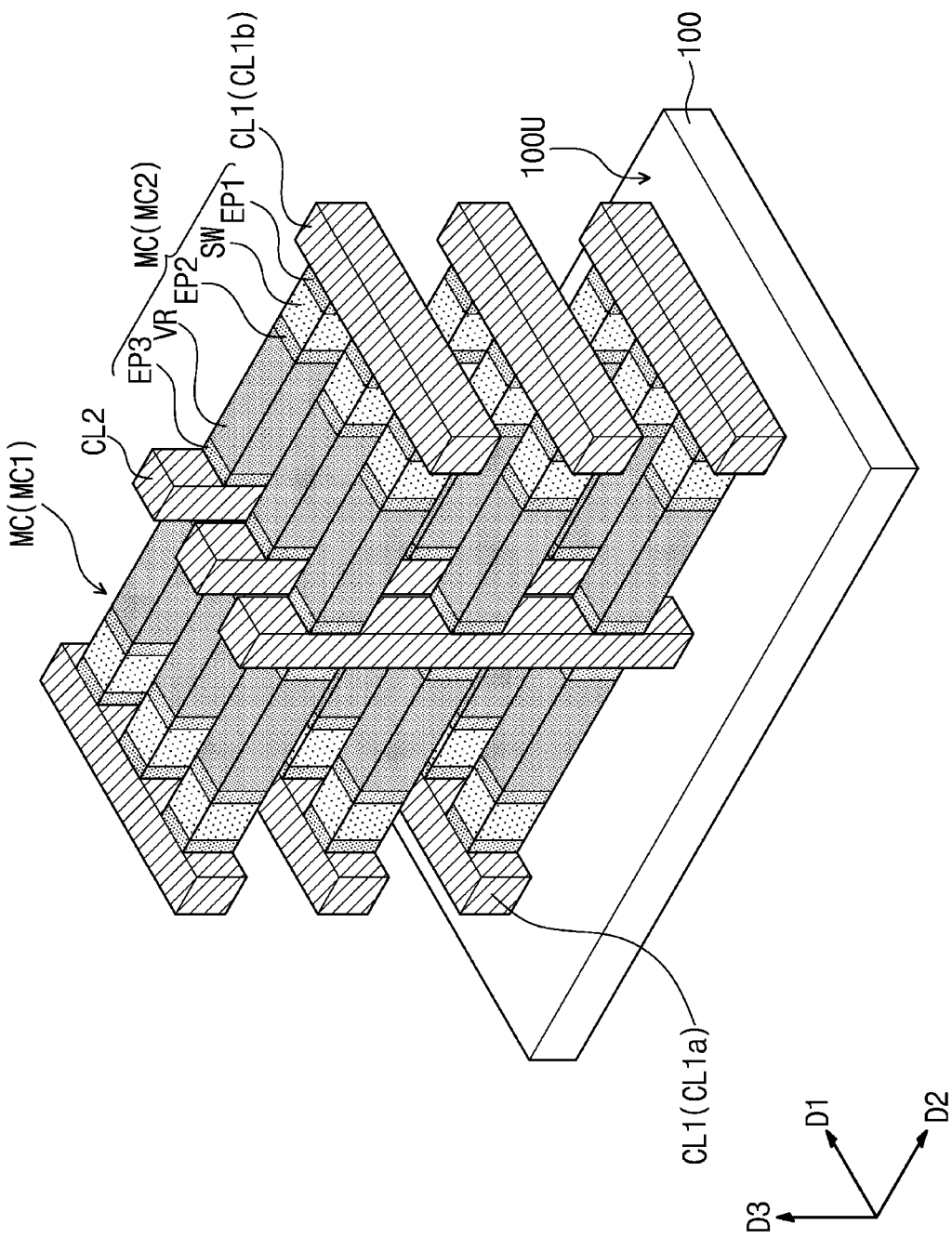
FIG. 21 illustrates a simplified perspective view showing a variable resistance memory device according to some example embodiments of the present inventive concepts.
Figure 22A:
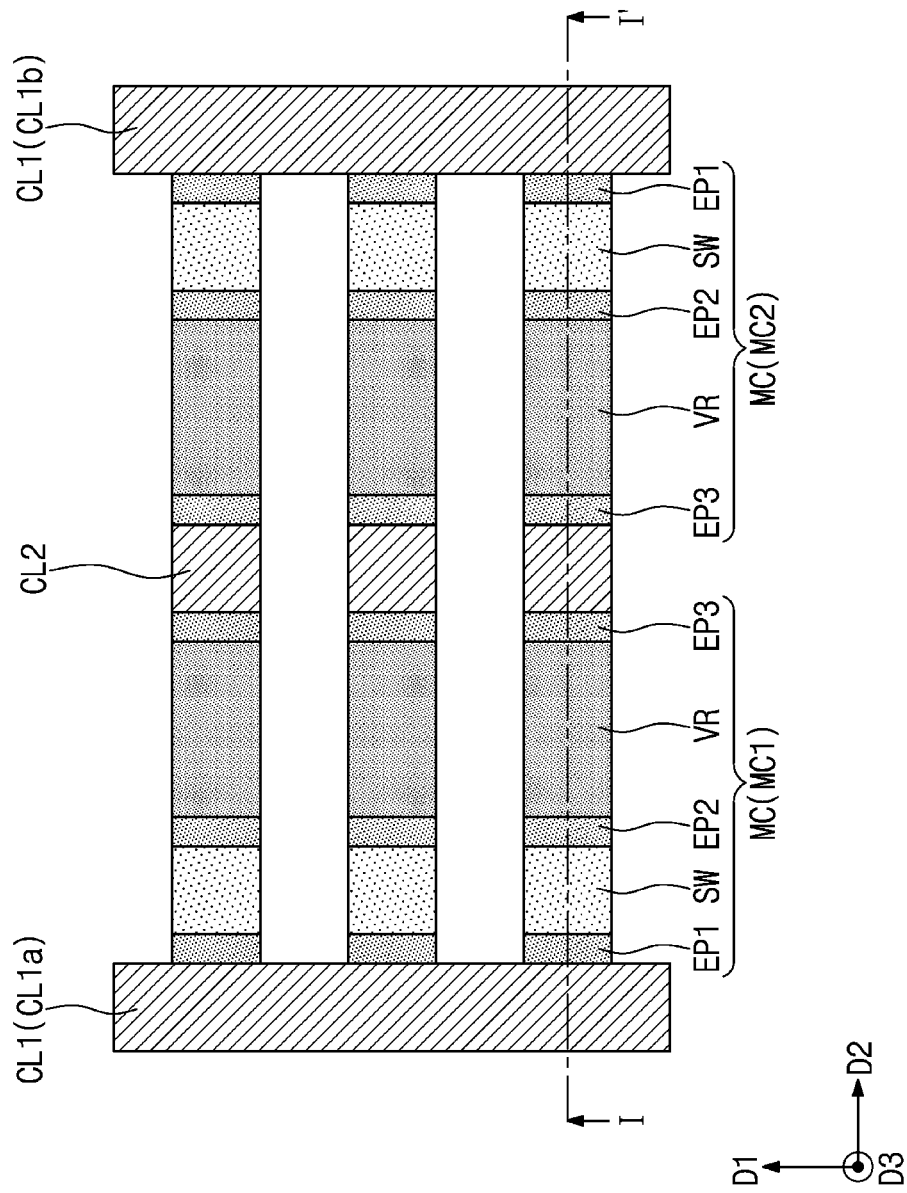
FIG. 22A illustrates a plan view showing the variable resistance memory device of FIG. 21.

FIG. 21 illustrates a simplified perspective view showing a variable resistance memory device according to some example embodiments of the present inventive concepts. FIG. 22A illustrates a plan view showing the variable resistance memory device of FIG. 21. FIG. 22B illustrates a cross-sectional view taken along line I-I' of FIG. 22A. The following will mainly describe differences from the variable resistance memory device discussed with reference to FIGS. 17, 18A, and 18B.

Referring to FIGS. 21, 22A, and 22B, according to the present embodiment, the first sub-conductive lines CL1a may extend in the first direction D1 and be spaced apart from each other in the third direction D3. The second sub-conductive lines CL1b may extend in the first direction D1 and be spaced apart from each other in the third direction D3. The second sub-conductive lines CL1b may be spaced apart in the second direction D2 from the first sub-conductive lines CL1a. The second conductive lines CL2 may extend in the third direction D3 and be spaced apart from each other in the first direction D1. According to the present embodiment, a variable resistance memory device may be configured substantially the same as the variable resistance memory device discussed with reference to FIGS. 17, 18A, and 18B, except for arrangement of the first and second conductive lines CL1 and CL2.

Figure 23:
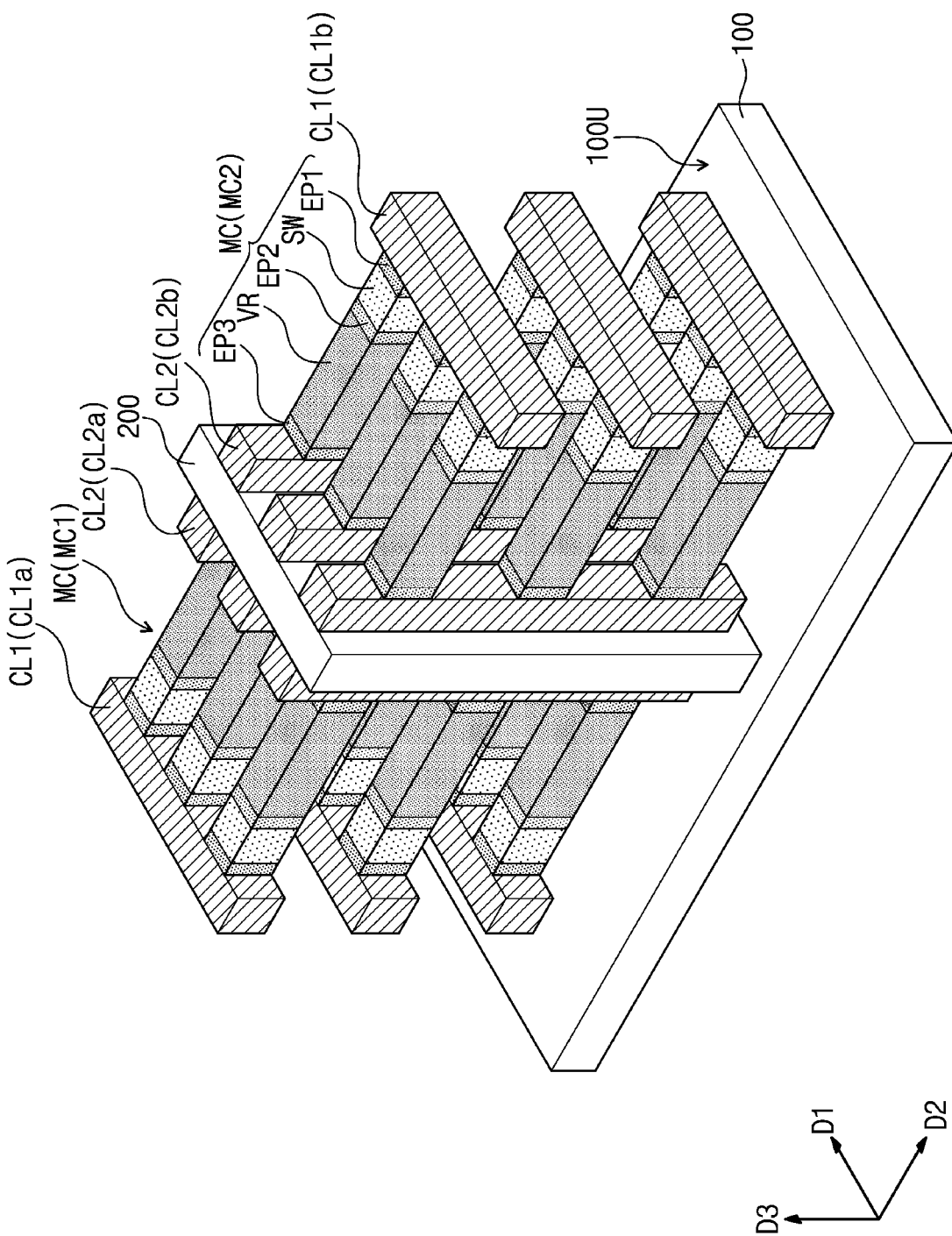
FIG. 23 illustrates a simplified perspective view showing a variable resistance memory device according to some example embodiments of the present inventive concepts.
Figure 24A:
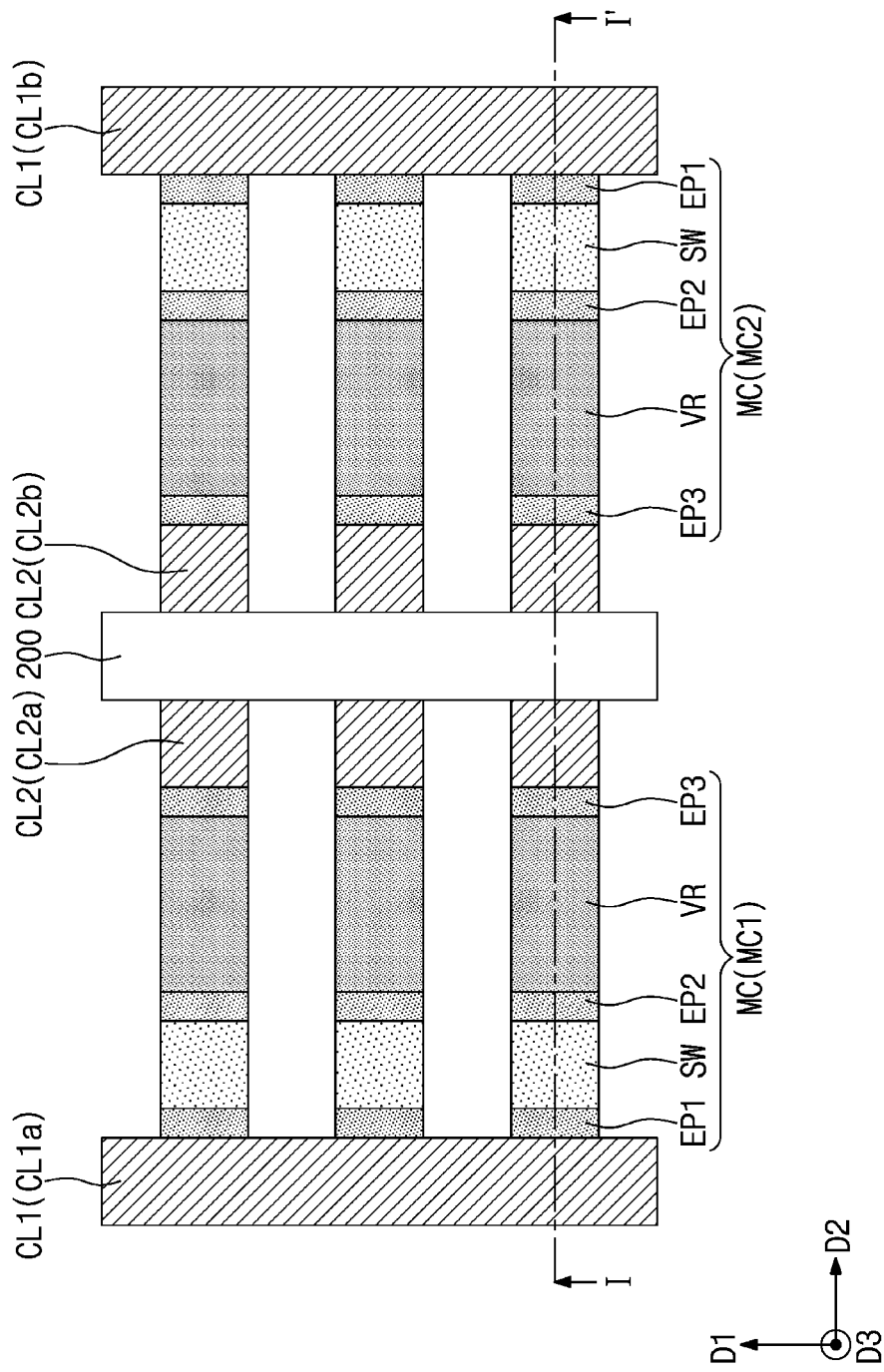
FIG. 24A illustrates a plan view showing the variable resistance memory device of FIG. 23.

FIG. 23 illustrates a simplified perspective view showing a variable resistance memory device according to some example embodiments of the present inventive concepts. FIG. 24A illustrates a plan view showing the variable resistance memory device of FIG. 23. FIG. 24B illustrates a cross-sectional view taken along line I-I' of FIG. 24A. The following will mainly describe differences from the variable resistance memory device discussed with reference to FIGS. 17, 18A, and 18B.

Referring to FIGS. 23, 24A, and 24B, according to the present embodiment, the first sub-conductive lines CL1a may extend in the first direction D1 and be spaced apart from each other in the third direction D3. The second sub-conductive lines CL1b may extend in the first direction D1 and be spaced apart from each other in the third direction D3. The second sub-conductive lines CL1b may be spaced apart in the second direction D2 from the first sub-conductive lines CL1a. The second conductive lines CL2 may include third sub-conductive lines CL2a adjacent to the first sub-conductive lines CL1a and also include fourth sub-conductive lines CL2b adjacent to the second sub-conductive lines CL1b. The third sub-conductive lines CL2a may extend in the third direction D3 and be spaced apart from each other in the first direction D1. The fourth sub-conductive lines CL2b may extend in the third direction D3 and be spaced apart from each other in the first direction D1. The fourth sub-conductive lines CL2b may be spaced apart in the second direction D2 from the third sub-conductive lines CL2a across a line dielectric pattern 200. According to the present embodiment, a variable resistance memory device may be configured substantially the same as the variable resistance memory device discussed with reference to FIGS. 19, 20A, and 20B, except for arrangement of the first and second conductive lines CL1 and CL2.

Figure 26A:
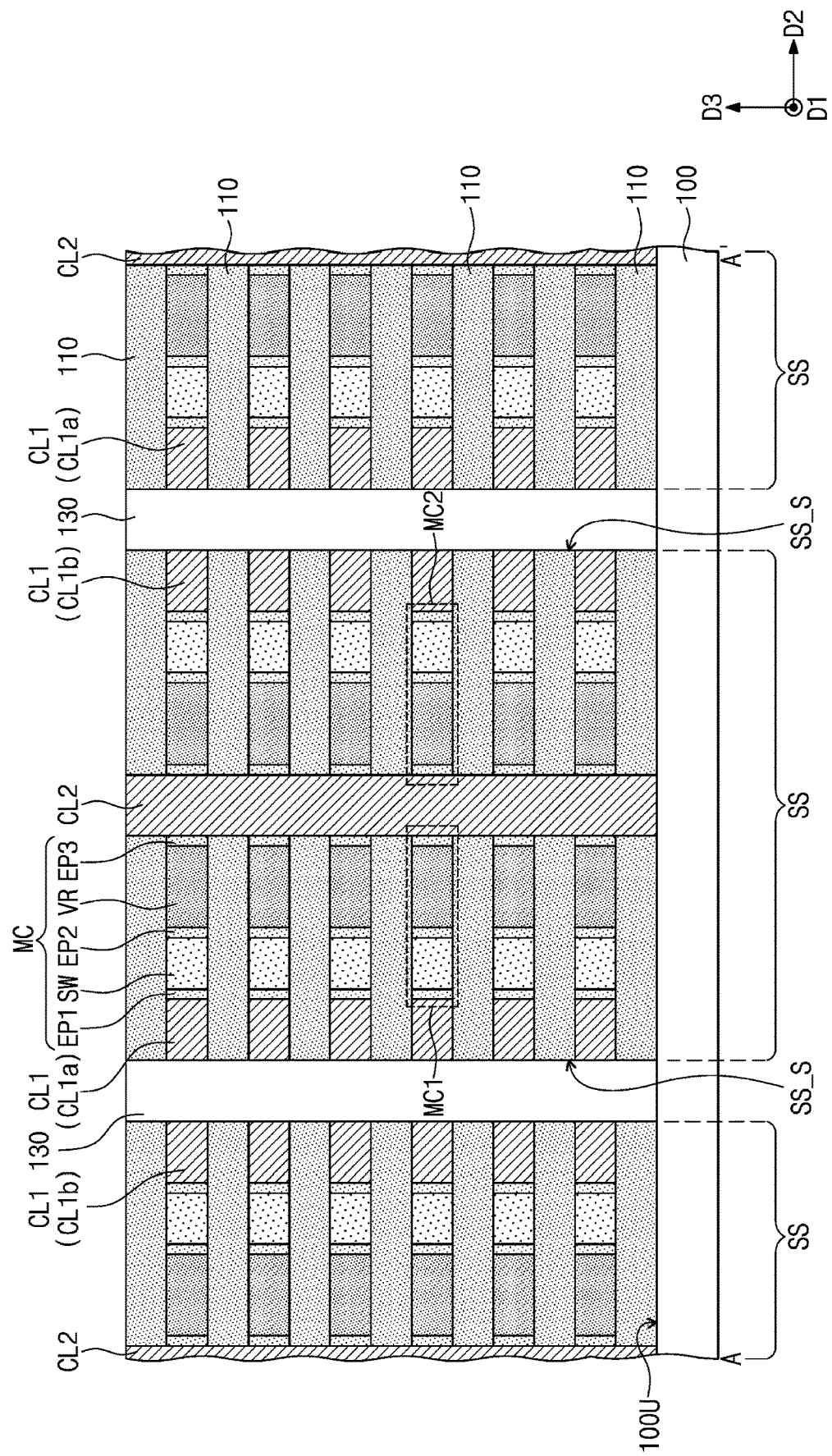
FIG. 26A illustrates a cross-sectional view taken along line A-A' of FIG. 25.
Figure 26B:
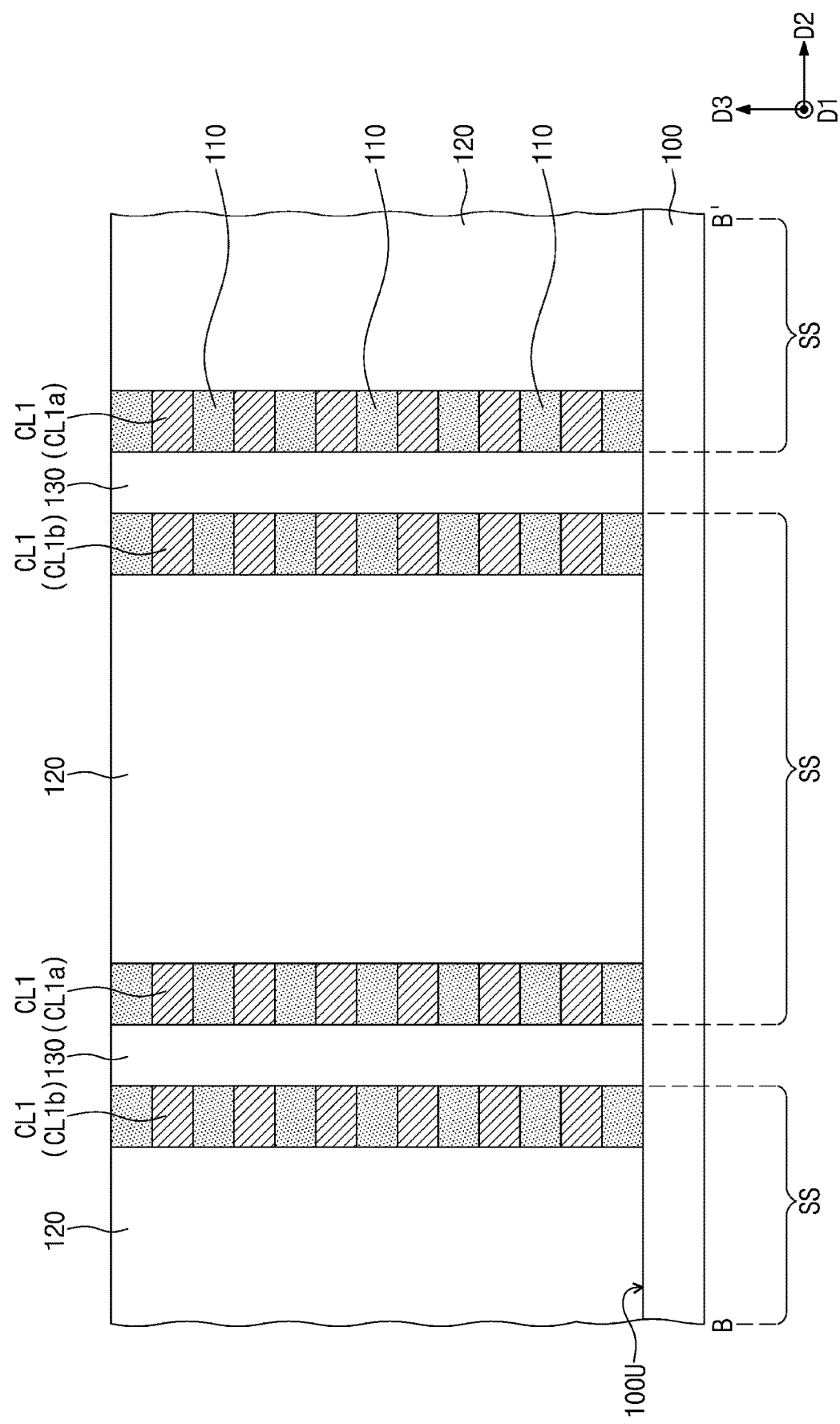
FIG. 26B illustrates a cross-sectional view taken along line B-B' of FIG. 25.

FIG. 25 illustrates a plan view showing a variable resistance memory device according to some example embodiments of the present inventive concepts. FIG. 26A illustrates a cross-sectional view taken along line A-A' of FIG. 25. FIG. 26B illustrates a cross-sectional view taken along line B-B' of FIG. 25. The following will mainly describe differences from the variable resistance memory device discussed with reference to FIGS. 3, 4A, 4B, and 4C.

Referring to FIGS. 25, 26A, and 26B, the stack structure SS may be provided on the substrate 100. The substrate 100 may be provided thereon with the isolation dielectric patterns 130 on opposite sides of the stack structure SS. The isolation dielectric patterns 130 may correspondingly cover opposite lateral surfaces SS_S of the stack structure SS. The isolation dielectric patterns 130 may extend in the first direction D1 and be spaced apart in the second direction D2 from each other across the stack structure SS. The stack structure SS may be spaced apart from a neighboring stack structure SS across the isolation dielectric pattern 130.

The stack structure SS may include the dielectric layers 110 and the first conductive lines CL1 that are alternately stacked in the third direction D3. The first conductive lines CL1 may extend in the first direction D1. The first conductive lines CL1 may include the first sub-conductive lines CL1a and the second sub-conductive lines CL1b. The first sub-conductive lines CL1a may extend in the first direction D1 and be spaced apart from each other in the third direction D3. The first sub-conductive lines CL1a may be separated from each other by the dielectric layers 110 therebetween. The second sub-conductive lines CL1b may extend in the first direction D1 and be spaced apart from each other in the third direction D3. The second sub-conductive lines CL1b may be separated from each other by the dielectric layers 110 therebetween. The second sub-conductive lines CL1b may be spaced apart in the second direction D2 from the first sub-conductive lines CL1a.

The stack structure SS may include the second conductive lines CL2 between the first sub-conductive lines CL1a and the second sub-conductive lines CL1b. The second conductive lines CL2 may extend in the third direction D3 and be spaced apart from each other in the first direction D1. The second conductive lines CL2 may run across the first sub-conductive lines CL1a and the second sub-conductive lines CL1b. Each of the second conductive lines CL2 may penetrate the dielectric layers 110.

The stack structure SS may include the vertical dielectric patterns 120 between the first sub-conductive lines CL1a and the second sub-conductive lines CL1b. The vertical dielectric patterns 120 may extend in the third direction D3 and be spaced apart from each other in the first direction D1.

The second conductive lines CL2 and the vertical dielectric patterns 120 may be alternately arranged in the first direction D1 between the first sub-conductive lines CL1a and the second sub-conductive lines CL1b.

The stack structure SS may include the memory cells MC at corresponding intersections between the first conductive lines CL1 and the second conductive lines CL2. The memory cells MC may include the first memory cells MC1 at corresponding intersections between the first sub-conductive lines CL1a and the second conductive lines CL2 and also include the second memory cells MC2 at corresponding intersections between the second sub-conductive lines CL1b and the second conductive lines CL2. Each of the memory cells MC may include the variable resistance element VR, the select element SW, the first electrode EP1 between the select element SW and a corresponding first conductive line CL1, the second electrode EP2 between the variable resistance element VR and the select element SW, and the third electrode EP3 between the variable resistance element VR and a corresponding second conductive line CL2. The variable resistance element VR, the select element SW, and the first to third electrodes EP1 to EP3 may be horizontally arranged in a parallel direction (e.g., the second direction D2) to the top surface 100U of the substrate 100. In an example embodiment, the variable resistance element VR, the select element SW, and the first to third electrodes EP1 to EP3 may be positioned at the same level in the third direction D3 from the top surface 100U of the substrate 100. Each of the memory cells MC may be locally provided between a pair of vertical dielectric patterns 120 neighboring each other in the first direction D1 and between a pair of dielectric layers 110 neighboring each other in the third direction D3. Therefore, the variable resistance element VR, the select element SW, and the first to third electrodes EP1 to EP3 may be horizontally arranged in the second direction D2 between the pair of vertical dielectric patterns 120 in the first direction D1 and between the pair of dielectric layers 110 in the third direction D3. The second memory cells MC2 may be configured symmetrically about the second conductive lines CL2 with the first memory cells MC1.

As discussed with reference to FIGS. 1, 2A, and 2B, the variable resistance element VR may include a material that stores data based on resistance variation. In certain embodiments, the select element SW may be a diode. For example, the select element SW may include either a silicon diode in which p-type Si and n-type Si are joined together or an oxide diode in which p-type NiOx and n-type TiOx, or p-type CuOx and n-type TiOx, are joined together. In other embodiments, the select element SW may be a device based on a threshold switching phenomenon having a nonlinear I-V curve (e.g., S-type I-V curve). For example, the select element SW may be an OTS (Ovonic Threshold Switch) device having bidirectional characteristics. In an example embodiment, the OTS device may be a bi-directional switch. In this case, the select element SW may include a chalcogenide material and be in a substantially amorphous state. In this description, the phrase "substantially amorphous state" may not exclude the presence of a locally crystalline grain boundary or a locally crystalline portion. The chalcogenide material may include a compound in which one or more of Te and Se (chalcogen elements) are combined with one or more of Ge, Sb, Bi, Al, Pb, Sn, Ag, As, S, Si, In, Ti, Ga, and P. For example, the chalcogenide material may include one or more of AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, and GeAsBiSe. In certain embodiments, the select element SW may further include an impurity, for example, one or more of C, N, B, and O. According to the present embodiment, the select elements SW of the variable resistance memory device are not limited to what is discussed with reference to FIGS. 3, 4A, 4B, and 4C.

According to the present inventive concepts, memory cells may be three-dimensionally stacked on a substrate, and each of the memory cells may include a variable resistance element and a select element that are horizontally arranged. Thus, it may be easy to provide a variable resistance memory device with increased integration.

The aforementioned description provides some example embodiments for explaining the present inventive concepts. Therefore, the present inventive concepts are not limited to the embodiments described above, and it will be understood by one of ordinary skill in the art that variations in form and detail may be made therein without departing from the spirit and essential features of the present inventive concepts.

What is claimed is:

1. A variable resistance memory device, comprising:
a plurality of first conductive lines extending in a first direction, the first direction being parallel to a lengthwise direction of each of the plurality of first conductive lines and being parallel to a top surface of a substrate;
a plurality of second conductive lines spaced apart in a second direction from the plurality of first conductive lines, the second direction being parallel to the top surface of the substrate and different from the first direction,
the plurality of second conductive lines extending in a third direction, the third direction being parallel to a lengthwise direction of each of the plurality of second conductive lines and being perpendicular to the top surface of the substrate, the plurality of second conductive lines being spaced apart from each other in the first direction,
the plurality of first conductive lines being spaced apart from each other in the third direction; and
a plurality of memory cells disposed between the plurality of first conductive lines and the plurality of second conductive lines and arranged spaced apart from each other in the first direction and the third direction,
wherein each of the memory cells including a variable resistance element and a select element that are horizontally arranged in the second direction,
wherein each of the plurality of second conductive lines is connected in common to a corresponding vertical group of the plurality of memory cells, the corresponding vertical group including at least two memory cells being spaced apart from each other in the third direction, and
wherein each of the at least two memory cells of the corresponding vertical group is connected to a corresponding one of the plurality of first conductive lines.

2. The variable resistance memory device of claim 1, wherein the select element includes a chalcogenide material in an amorphous state.

3. The variable resistance memory device of claim 1, wherein each of the plurality of memory cells further includes an electrode between the variable resistance element and the select element.

4. The variable resistance memory device of claim 3, wherein the variable resistance element, the select element, and the electrode are positioned at the same level from the top surface of the substrate and horizontally arranged in the second direction.

5. A variable resistance memory device, comprising:
a first conductive line on a substrate and extending in a first direction, the first direction being parallel to a lengthwise direction of the first conductive line and being parallel to a top surface of the substrate;
a plurality of memory cells and a plurality of vertical dielectric patterns alternately arranged in the first direction on a lateral surface of the first conductive line, each of the plurality of memory cells including a variable resistance element and a select element that are horizontally arranged in a second direction that is parallel to the top surface of the substrate and intersects the first direction; and
a plurality of second conductive lines respectively connected to the plurality of memory cells,
wherein the plurality of second conductive lines extend in a third direction, the third direction being parallel to a lengthwise direction of each of the plurality of second conductive lines and being perpendicular to the top surface of the substrate, the plurality of second conductive lines being spaced apart from each other in the first direction, and
wherein each of the plurality of vertical dielectric patterns extends in the second direction and is disposed between two adjacent second conductive lines of the plurality of second conductive lines.

6. The variable resistance memory device of claim 5,
wherein the plurality of second conductive lines are spaced apart in the second direction from the first conductive line, and
wherein the variable resistance element and the select element that are included in each of the memory cells are interposed between the first conductive line and a corresponding one of the plurality of second conductive lines.

7. The variable resistance memory device of claim 5,
wherein the plurality of vertical dielectric patterns and the plurality of second conductive lines are alternately disposed in the first direction.

* * * * *